(12) United States Patent
Balakrishnan et al.

(10) Patent No.: US 10,361,199 B2
(45) Date of Patent: Jul. 23, 2019

(54) VERTICAL TRANSISTOR TRANSMISSION GATE WITH ADJACENT NFET AND PFET

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 15/812,288

(22) Filed: Nov. 14, 2017

(65) Prior Publication Data

US 2018/0233502 A1   Aug. 16, 2018

Related U.S. Application Data

(63) Continuation of application No. 15/434,753, filed on Feb. 16, 2017.

(51) Int. Cl.
*H01L 29/06* (2006.01)
*H01L 29/10* (2006.01)
(Continued)

(52) U.S. Cl.
CPC ...... *H01L 27/092* (2013.01); *H01L 21/76224* (2013.01); *H01L 21/823828* (2013.01); *H01L 21/823885* (2013.01); *H01L 29/0649* (2013.01); *H01L 29/1083* (2013.01); *H01L 29/6653* (2013.01); *H01L 29/66545* (2013.01); *H01L 29/66666* (2013.01); *H01L 29/7827* (2013.01); *H01L 21/823871* (2013.01); *H01L 21/823878* (2013.01)

(58) Field of Classification Search
CPC ........... H01L 29/7827; H01L 29/66666; H01L 27/092; H01L 27/0928; H01L 29/6653; H01L 29/66545; H01L 21/823885
See application file for complete search history.

(56) References Cited

U.S. PATENT DOCUMENTS

| 4,670,768 | A |  | 6/1987 | Sunami et al. |
| 5,155,054 | A | * | 10/1992 | Itoh ................... H01L 29/66666 |
| | | | | 257/329 |

(Continued)

*Primary Examiner* — Jessica S Manno
*Assistant Examiner* — Sean P Hagan
(74) *Attorney, Agent, or Firm* — Scully, Scott, Murphy & Presser, P.C.; L. Jeffrey Kelly, Esq.

(57) ABSTRACT

A complementary metal oxide semiconductor (CMOS) vertical transistor structure with closely spaced p-type and n-type vertical field effect transistors (FETs) is provided. After forming a dielectric material portion contacting a proximal sidewall of a first semiconductor fin for formation of a p-type vertical FET and a proximal sidewall of a second semiconductor fin for formation of an n-type vertical FET, a first gate structure is formed contacting a distal sidewall of the first semiconductor fin, and a second gate structure is formed contacting a distal sidewall of the second semiconductor fin. Because no gate structures are formed between the first and second semiconductor fins, the p-type vertical FET is spaced from the n-type FET only by the dielectric material portion.

9 Claims, 32 Drawing Sheets

(51) Int. Cl.
*H01L 29/66* (2006.01)
*H01L 29/78* (2006.01)
*H01L 21/762* (2006.01)
*H01L 27/092* (2006.01)
*H01L 21/8238* (2006.01)

(56) References Cited

U.S. PATENT DOCUMENTS

| | | |
|---|---|---|
| 6,632,712 B1 | 10/2003 | Ang et al. |
| 9,525,064 B1 | 12/2016 | Balakrishnan et al. |
| 2001/0017392 A1* | 8/2001 | Comfort ......... H01L 21/823885 257/410 |
| 2015/0014765 A1* | 1/2015 | Huang ............ H01L 21/823814 257/329 |
| 2015/0171032 A1 | 6/2015 | Colinge et al. |
| 2016/0268256 A1* | 9/2016 | Yang .................... H01L 27/088 |
| 2016/0268382 A1 | 9/2016 | Colinge et al. |
| 2018/0233501 A1 | 8/2018 | Balakrishnan et al. |

\* cited by examiner

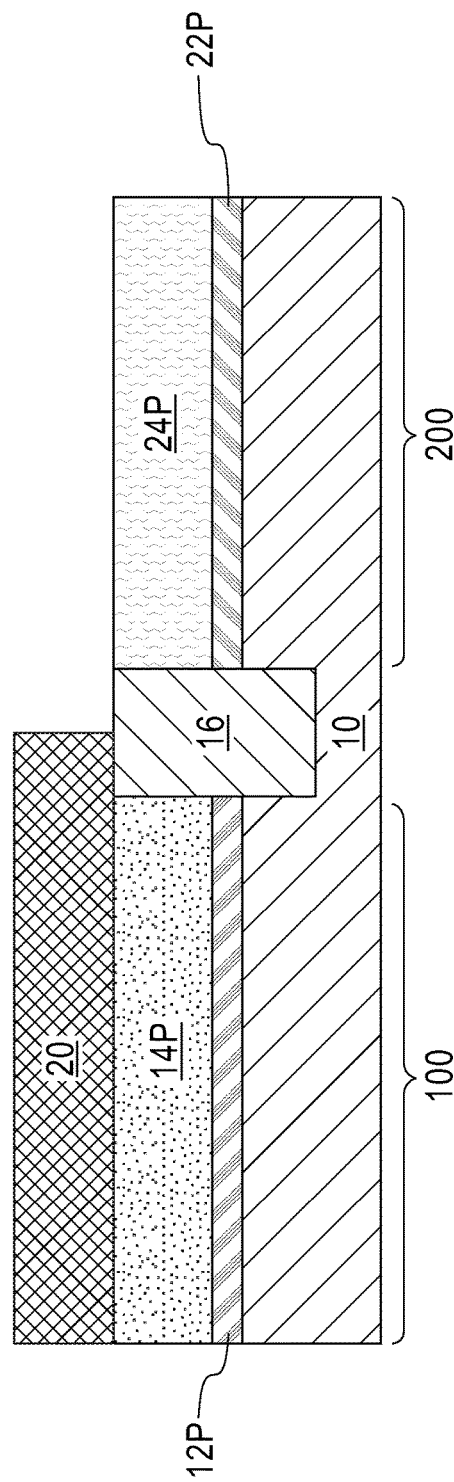
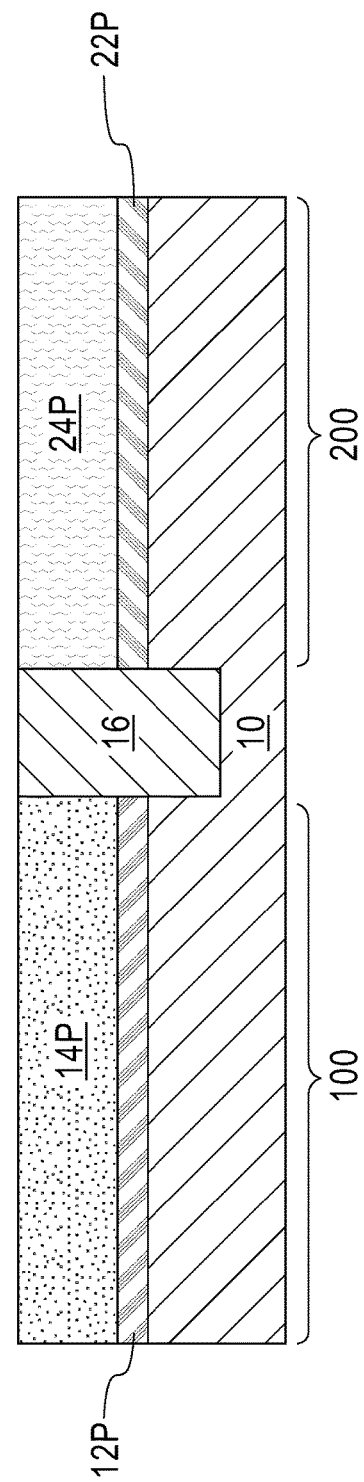
FIG. 4
FIG. 5

VERTICAL TRANSISTOR TRANSMISSION GATE WITH ADJACENT NFET AND PFET

BACKGROUND

The present application relates to complementary metal oxide semiconductor (CMOS) transistors, and more specifically to CMOS vertical transistors.

CMOS is used for constructing integrated circuits. CMOS technology can be used in microprocessors, microcontrollers, static RAM, and other digital logic circuits. CMOS designs commonly use complementary and symmetrical pairs of p-type and n-type metal oxide semiconductor field effect transistors (MOSFETs) for logic functions.

Vertical transistors are attractive candidates for 5 nm node and beyond due to better density scaling. Vertical transistors also allow relaxed gate lengths for better control of electrostatics. However, there remains a need for improved methods and structures for fabrication of CMOS vertical transistors with tight pitch, which results in a high device packing density.

SUMMARY

The present application provides a CMOS vertical transistor structure with closely spaced p-type and n-type vertical FETs. For each pair of semiconductor fins, a gate structure for each vertical FET is formed to be absent from a proximal sidewall of each semiconductor fin. The semiconductor fins in each semiconductor fin pair thus are spaced from each other only by a dielectric material portion formed therebetween. As a result, a high packing density of CMOS vertical transistors can be achieved.

According to an embodiment, a semiconductor structure is provided. The semiconductor structure includes a first doped bottom semiconductor portion located over a first region of a semiconductor substrate, a second doped bottom semiconductor portion located over a second region of the semiconductor substrate, a pair of semiconductor fins including a first semiconductor fin extending upwards from a top surface of the first doped bottom semiconductor portion and a second semiconductor fin extending upwards from a top surface of the second doped bottom semiconductor portion, a first doped top semiconductor portion surrounding a top portion of the first semiconductor fin, a second doped top semiconductor portion surrounding a top portion of the second semiconductor fin, a first gate structure disposed along sidewalls of a channel portion of the first semiconductor fin, a second gate structure disposed along sidewalls of a channel portion of the second semiconductor fin and a dielectric fill portion located between the first semiconductor fin and the second semiconductor fin and contacting the proximal sidewall of the channel portion of the first semiconductor fin and the proximal sidewall of the channel portion of the second semiconductor fin. The first gate structure is absent from a proximal sidewall of the channel portion of the first semiconductor fin that is proximate to the second semiconductor fin, and the second gate structure is absent from a proximal sidewall of the channel portion of the second semiconductor fin that is proximate to the second semiconductor fin.

According to another embodiment, a method of forming a semiconductor structure is provided. The method includes first forming a first doped bottom semiconductor portion over a first region of a semiconductor substrate and forming a second doped bottom semiconductor portion over a second region of the semiconductor substrate. A sacrificial gate layer is then formed over the first doped bottom semiconductor portion and the second doped bottom semiconductor portion followed by forming a dielectric capping layer over the sacrificial gate layer. Next, a first semiconductor fin is formed within a first trench that extends through the dielectric capping layer and the sacrificial gate layer and contacts a surface of a portion of the first doped bottom semiconductor portion, while a second semiconductor fin is formed in a second trench that extends through the dielectric capping layer and the sacrificial gate layer and contacts a surface of a portion of the second doped bottom semiconductor portion. Next, entire portions of the dielectric capping layer and the sacrificial gate layer located between the first semiconductor fin and the second semiconductor fin are removed to provide an opening exposing a proximal sidewall of the first semiconductor fin and a proximal sidewall of the second semiconductor fin. A dielectric fill portion is subsequently formed within the opening. The dielectric fill portion contacts the proximal sidewall of the first semiconductor fin and the proximal sidewall of the second semiconductor fin. Next, after removing the sacrificial gate layer to expose a channel portion of the first semiconductor fin and a channel portion of the second semiconductor fin, a first gate structure is formed along sidewalls of the channel portion of the first semiconductor fin that are not covered by the dielectric fill portion and a second gate structure is formed along sidewalls of the channel portion of the second semiconductor fin that are not covered by the dielectric fill portion. The dielectric capping layer is then removed to expose a top portion of each of the first semiconductor fin and the second semiconductor fin. Next, a first doped top semiconductor portion is formed surrounding the top portion of the first semiconductor fin, and a second doped top semiconductor portion is formed surrounding the top portion of the second semiconductor fin.

BRIEF DESCRIPTION OF THE DRAWINGS

FIG. 4 is a cross-sectional view of the exemplary semiconductor structure of FIG. 3 after forming a stack of a second doped semiconductor PTS portion and a second doped bottom semiconductor portion in a second device region of the semiconductor substrate that is not covered by the first patterned mask layer.

FIG. 5 is a cross-sectional view of the exemplary semiconductor structure of FIG. 4 after removing the first patterned mask layer.

DETAILED DESCRIPTION

Figure 1:
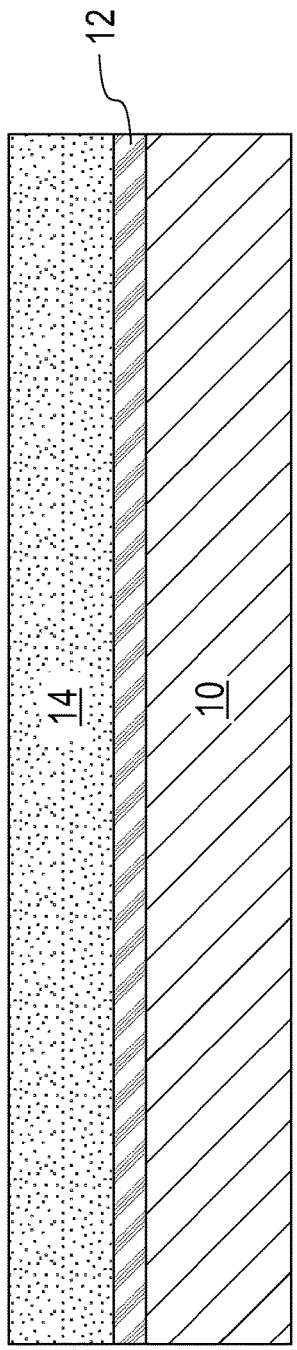
FIG. 1 is a cross-sectional view of an exemplary semiconductor structure according to an embodiment of the present application after forming a first doped semiconductor punch through stop (PTS) layer and a first doped bottom semiconductor layer on a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference to FIG. 1, an exemplary semiconductor structure according to an embodiment of the present application is shown and includes, from bottom to top, a semiconductor substrate 10, a first doped semiconductor punch through stop (PTS) layer 12, and a first doped bottom semiconductor layer 14.

The semiconductor substrate 10 can be a bulk semiconductor substrate including at least one semiconductor material that contiguously extends from the topmost surface of the semiconductor substrate 10 to a bottommost surface of the semiconductor substrate 10 or a top semiconductor material layer of a semiconductor-on-insulator (SOI) substrate. The semiconductor substrate 10 may include any semiconductor material including, for example, Si, Ge, SiGe, SiC, SiGeC, InAs, InP, InAsP, GaAs, and all other III-V or II-VI compound semiconductor materials. In one embodiment of the present application, the semiconductor substrate 10 is composed of silicon. The semiconductor material that provides the semiconductor substrate 10 is typically a single crystalline semiconductor such as, for example, single crystalline silicon.

The first doped semiconductor PTS layer 12 may include any semiconductor material as mentioned above for the semiconductor substrate 10. In one embodiment of the present application, the first doped semiconductor PTS layer 12 includes a same semiconductor material as the semiconductor material that provides the semiconductor substrate 10. For example, both the first doped semiconductor PTS layer 12 and the semiconductor substrate 10 may be composed of silicon. In another embodiment of the present application, the first doped semiconductor PTS layer 12 includes a different semiconductor material than the semiconductor material that provides the semiconductor substrate 10. For example, the first doped semiconductor PTS layer 12 may be composed of SiGe and the semiconductor substrate 10 may be composed of silicon.

The first doped semiconductor PTS layer 12 includes a p-type or an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The first doped semiconductor PTS layer 12 is heavily doped and has a dopant concentration ranging from $1 \times 10^{21}$ atoms/cm$^3$ to $1 \times 10^{22}$ atoms/cm$^3$. The thickness of the first doped semiconductor PTS layer 12 can be from 10 nm to 50 nm, although lesser and greater thicknesses can also be employed.

In some embodiments of the present application, the first doped semiconductor PTS layer 12 can be formed by introducing the dopant into an upper portion of the semiconductor substrate 10 using ion implantation or gas phase doping. In other embodiments of the present application, the first doped semiconductor PTS layer 12 can be formed utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material layer that is formed by an epitaxial deposition process has the same crystalline characteristics as the deposition surface on which it is formed. For example, an epitaxial semiconductor material layer deposited on a {100} crystal surface will take on a {100} orientation. In the present application, the first doped semiconductor PTS layer 12 has an epitaxial relationship, i.e., same crystal orientation, as that of the underlying semiconductor substrate 10.

Examples of various epitaxial growth processes that are suitable for use in forming the first doped semiconductor PTS layer 12 include, e.g., chemical vapor deposition (CVD), molecular beam epitaxy (MBE) and metal-organic chemical vapor deposition (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the semiconductor material that provides the first doped semiconductor PTS layer 12. In some embodiments, the source gas for the deposition of the semiconductor material that provides the first doped semiconductor PTS layer 12 includes a silicon source gas, a germanium source gas or a mixture of a silicon-containing source gas and a germanium-containing source gas. Carrier gases like hydrogen, nitrogen, helium and argon can be used.

In some embodiments, the dopant can be introduced in-situ as the semiconductor material that provides the first doped semiconductor PTS layer 12 is being deposited, i.e., during the epitaxial growth process. In other embodiments, the dopant can be introduced into the first doped semiconductor PTS layer 12 after the epitaxial growth process, for example, by ion implantation.

The first doped bottom semiconductor layer 14 may include a semiconductor material the same as, or different from, the semiconductor material that provides the first doped semiconductor PTS layer 12. The first doped bottom semiconductor layer 14 is counter-doped with respect to the first doped semiconductor PTS layer 12 and thus includes a dopant having a conductivity type opposite to that of the dopant in the first doped semiconductor PTS layer 12. For example, when the first doped semiconductor PTS layer 12 includes a p-type dopant, the first doped bottom semiconductor layer 14 includes an n-type dopant, and when the first doped semiconductor PTS layer 12 includes an n-type dopant, the first doped semiconductor layer 14 includes a p-type dopant. The dopant concentration of the first doped bottom semiconductor layer 14 can be from $1\times10^{19}$ atoms/cm$^3$ to $1\times10^{21}$ atoms/cm$^3$, although lesser and greater dopant concentration can also be employed. In one embodiment, the first doped semiconductor PTS layer 12 is composed of p-doped silicon, and the first doped bottom semiconductor layer 14 is composed of n-doped silicon for formation of an n-type FET (NFET).

The first doped bottom semiconductor layer 14 may be formed using an epitaxial growth process described above in formation of the first doped semiconductor PTS layer 12. For example, the first doped bottom semiconductor layer 14 can be formed by CVD or MBE. The first doped bottom semiconductor layer 14 thus has a same crystalline orientation as that of the first doped semiconductor PTS layer 12. The thickness of the first doped bottom semiconductor layer 14 can be from 50 nm to 200 nm, although lesser and greater thicknesses can also be employed.

Figure 2:
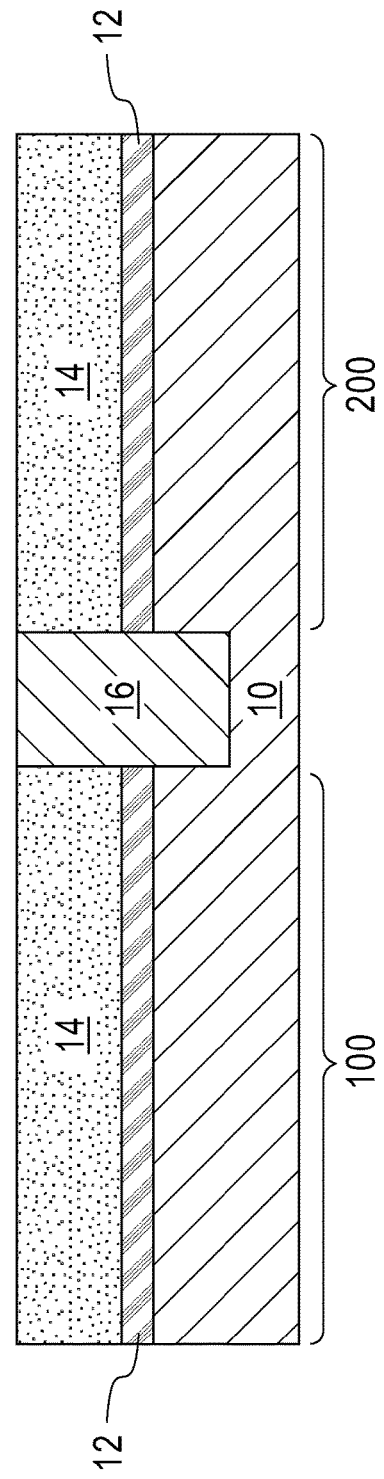
FIG. 2 is a cross-sectional view of the exemplary semiconductor structure of FIG. 1 after forming a shallow trench isolation (STI) structure.

Referring now to FIG. 2, there is illustrated the exemplary semiconductor structure of FIG. 1 after forming a shallow trench isolation (STI) structure 16 through the first doped bottom semiconductor layer 14, the first doped semiconductor PTS layer 12 and in an upper portion of the semiconductor substrate 10. The STI structure 16 is position to define a first device region 100 and a second device region 200. In one embodiment, the first device region 100 is an area in which an n-type semiconductor device (e.g. NFET) can be subsequently formed, while the second device region 200 is an area in which a p-type semiconductor device (e.g. PFET) can be subsequently formed.

The STI structure 16 may include a dielectric material such as silicon dioxide, silicon nitride, silicon oxynitride or a combination thereof. In one embodiment, the STI structure 16 can be formed by first forming a shallow trench extending through the first doped bottom semiconductor layer 14, the first doped semiconductor PTS layer 12 and into an upper portion of the semiconductor substrate 10 and then filling the trench with a dielectric material. The shallow trench can be formed by applying a photoresist layer (not shown) over the first doped bottom semiconductor layer 14, lithographically patterning the photoresist layer, and transferring the pattern through the first doped bottom semiconductor layer 14, the first doped semiconductor PTS layer 12 and into the upper portion of the semiconductor substrate 10 by an etch. The etch can be an anisotropic etch such as reactive ion etch (RIE) or a plasma etch. The dielectric material can be deposited by CVD or physical vapor deposition (PVD). Excess dielectric material can then be removed from above the top surface of the first doped bottom semiconductor layer 14, for example, by chemical mechanical planarization (CMP). After planarization, the top surface of the STI structure 16 is coplanar with the top surface of the first doped bottom semiconductor layer 14.

Figure 3:
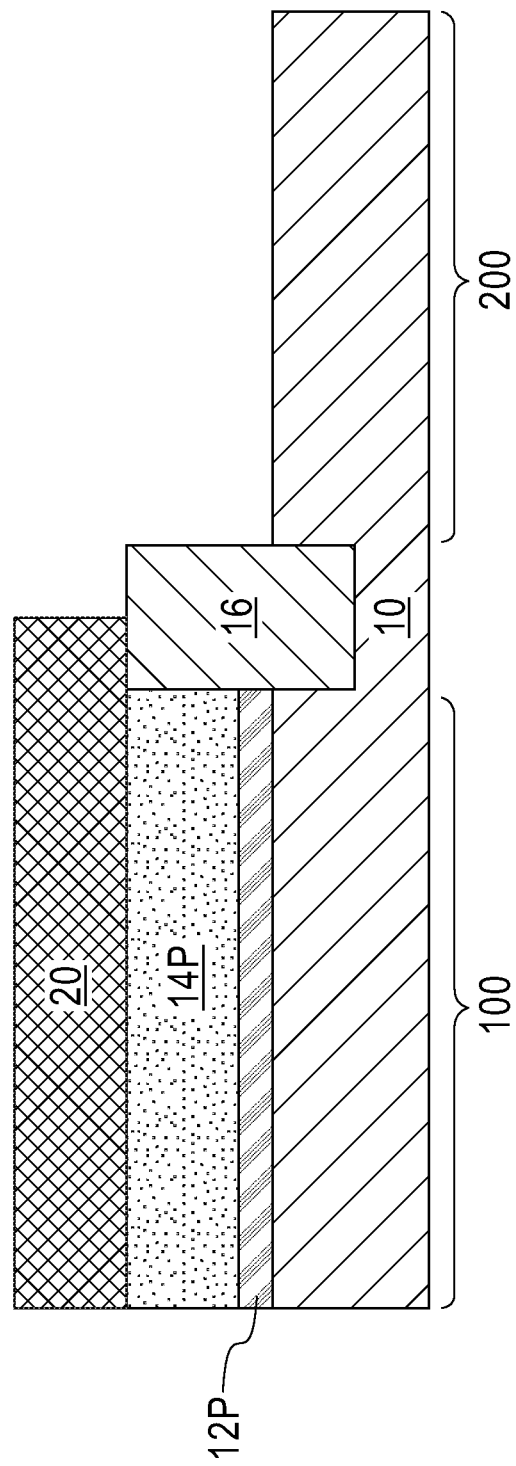
FIG. 3 is a cross-sectional view of the exemplary semiconductor structure of FIG. 2 after forming a first patterned mask layer over a first device region of the semiconductor substrate and patterning the first doped PTS layer and the first doped bottom semiconductor layer to form a stack of a first doped semiconductor PTS portion and a first doped bottom semiconductor portion in the first device region of the semiconductor substrate.

Referring now to FIG. 3, there is illustrated the exemplary semiconductor structure of FIG. 2 after forming a first patterned mask layer 20 over the first device region 100 and removing the first doped bottom semiconductor layer 14 and the first doped semiconductor PTS layer 12 from the second device region 200. As shown, a portion of the first doped bottom semiconductor layer 14 (herein referred to as a first doped bottom semiconductor portion 14P) and a portion of the first doped semiconductor PTS layer 12 (herein referred to as a first doped semiconductor PTS portion 12P) underlying the first patterned mask layer 20 remain in the first device region 100. Sidewalls of both the first doped semiconductor PTS portion 12P and the first doped bottom semiconductor portion 14P are in direct contact with a sidewall of the STI structure 16. The first doped bottom semiconductor portion 14P serves as a source region for a first FET subsequently formed in the first device region 100.

In one embodiment, the first patterned mask layer 20 can be formed by applying a first mask layer (not shown) over the entirety of the first doped bottom semiconductor layer 14 and lithographically patterning the first mask layer to remove the first mask layer from the second device layer 200. The first mask layer may be a photoresist layer or a photoresist layer in conjunction with hard mask layer(s). The remaining portion of the first mask layer constitutes the first patterned mask layer 20.

Subsequently, physically exposed portions of the first doped bottom semiconductor layer 14 and the first doped semiconductor PTS layer 12 in the second device region 200 are etched employing the first patterned mask layer 20 as an etch mask. The etch employed to remove the physically exposed portions of the first doped bottom semiconductor layer 14 and the first doped semiconductor PTS layer 12 can be an anisotropic etch such as, for example, RIE. After etching, a top surface of a portion of the semiconductor substrate 10 in the second device region 200 is exposed.

Referring now to FIG. 4, there is illustrated the exemplary semiconductor structure of FIG. 3 after forming a second doped semiconductor PTS portion 22P on the physically exposed surface of the semiconductor substrate 10 in the second device region 200 and forming a second doped bottom semiconductor portion 24P on the second doped semiconductor PTS portion 22P.

The second doped semiconductor PTS portion 22P may include any semiconductor material as mentioned above for the semiconductor substrate 10. The second doped semiconductor PTS portion 22P is counter-doped with respect to the first doped PTS material portion 12P. For example, when the first doped semiconductor PTS portion 12P includes a p-type dopant, the second doped semiconductor PTS portion 22P includes an n-type dopant, and vice versa. The dopant concentration of the second doped semiconductor PTS portion 22P can be from $1\times10^{21}$ atoms/cm$^3$ to $1\times10^{22}$ atoms/cm$^3$, although lesser and greater dopant concentration can also be employed.

The second doped semiconductor PTS portion 22P can be formed by a selective epitaxial growth process in which the semiconductor material that provides the second doped semiconductor PTS portion 22P is formed only on semiconductor surfaces (e.g., the surface of the physically exposed portion of the semiconductor substrate 10), but not on dielectric surfaces (e.g., exposed surfaces of the first patterned mask layer 20 and the STI structure 16). In one embodiment, the second doped semiconductor PTS portion 22P can be formed, for example, by CVD or MBE. The second doped semiconductor PTS portion 22P may be grown to a thickness such that a top surface of the second doped semiconductor PTS portion 22P is coplanar with the top surface of the first doped semiconductor PTS portion 12P.

The second doped bottom semiconductor portion 24P may include a semiconductor material the same as, or different from the semiconductor material that provides the first doped semiconductor PTS portion 12P. The second doped bottom semiconductor portion 24P is counter-doped with respect to the second doped semiconductor PTS portion 22P. For example, when the second doped PTS material portion 22P includes an n-type dopant, the second doped bottom semiconductor portion 24P includes a p-type dopant, and vice versa. The dopant concentration of the second doped bottom semiconductor portion 24P can be from $1\times10^{19}$ atoms/cm$^3$ to $1\times10^{21}$ atoms/cm$^3$, although lesser and greater dopant concentration can also be employed. In one embodiment, the second doped semiconductor PTS portion 22P is composed of n-doped silicon, and the second doped bottom semiconductor portion 24P is composed of p-doped silicon for formation of a p-type FET (PFET). The second doped bottom semiconductor portion 24P serves as a source region for a second FET subsequently formed in the second device region 200.

The second doped bottom semiconductor portion 24P can be formed by a selective epitaxial growth process as mentioned above for the formation of the second doped PTS portion 22P. The second doped bottom semiconductor portion 24P may grow exceeding the level of the first doped bottom semiconductor portion 14P. The second doped bottom semiconductor portion 24P may be subsequently recessed, for example, by a recess etch such that a top surface of the second doped bottom semiconductor portion 24P is coplanar with the top surface of first doped bottom semiconductor portion 14P.

Referring now to FIG. 5, there is illustrated the exemplary semiconductor structure of FIG. 4 after removing the first patterned mask layer 20. The first patterned mask layer 20 can be removed, for example, by oxygen-based plasma etching.

Optionally, after removal of the first patterned mask layer 20, a planarization process such as, for example, CMP may be performed to planarize the first doped bottom semiconductor portion 14P, the second doped bottom semiconductor portion 24P and the STI structure 16. The top surfaces of the first doped bottom semiconductor portion 14P, the second doped bottom semiconductor portion 24P and the STI structure 16 are thus coplanar with one another.

Figure 6:
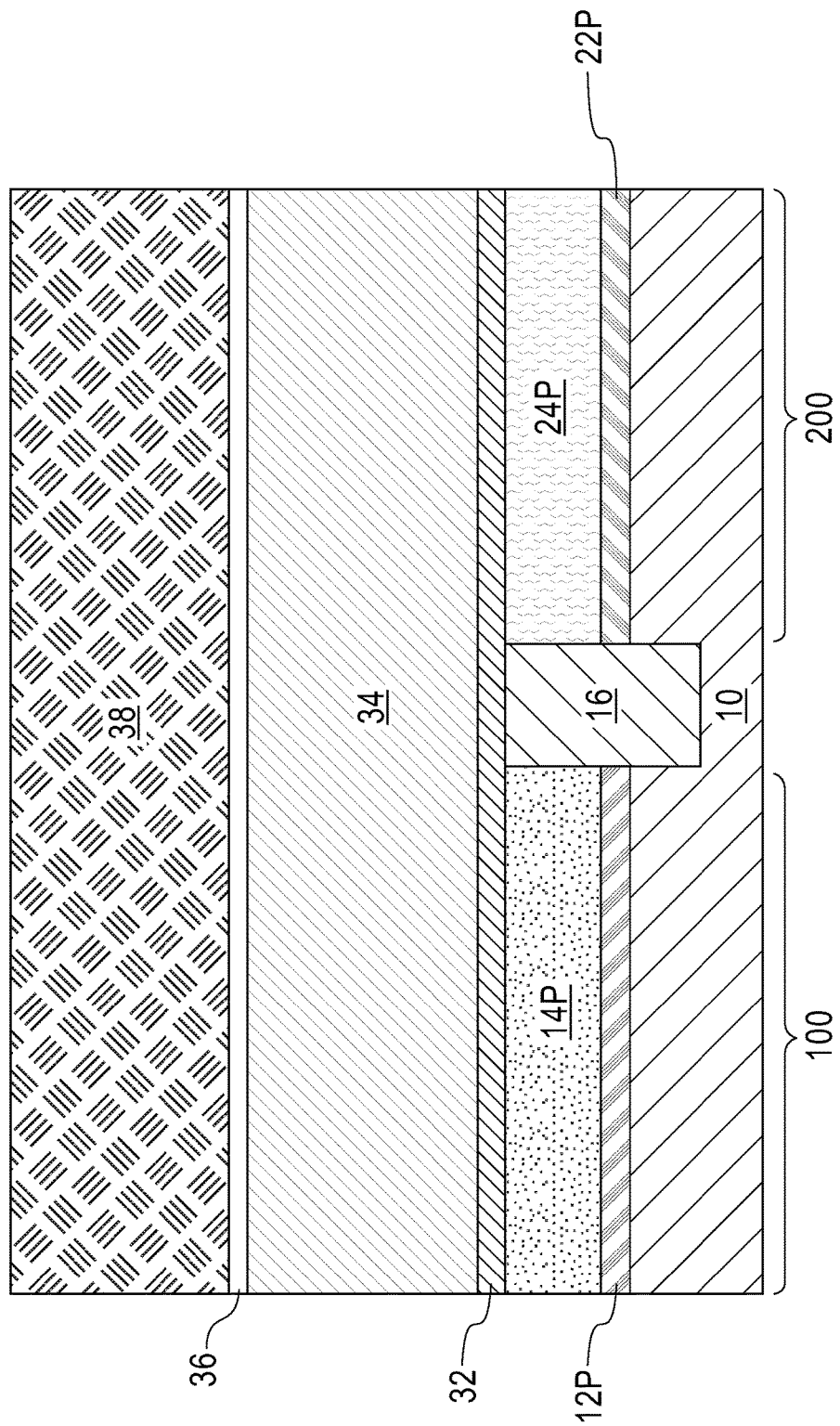
FIG. 6 is a cross-sectional view of the exemplary semiconductor structure of FIG. 5 after forming a material stack of a first spacer layer, a sacrificial gate layer, a second spacer layer and a dielectric capping layer over the first doped bottom semiconductor portion, the second doped bottom semiconductor portion and the STI structure.

Referring now to FIG. 6, there is illustrated the exemplary semiconductor structure of FIG. 5 after forming a material stack including, from bottom to top, a first spacer layer 32, a sacrificial gate layer 34, a second spacer layer 36 and a dielectric capping layer 38 over the first doped bottom semiconductor portion 14P, the second doped bottom semiconductor portion 24P and the STI structure 16.

Each of the first spacer layer 32 and the second spacer layer 36 may include a dielectric material such as, for example, silicon nitride, SiOCN or SiBCN. The first spacer layer 32 and the second spacer layer 36 may be formed by a deposition process such as, for example, CVD or PVD. The first spacer layer 32 and the second spacer layer 36 may each have a thickness from 5 nm to 10 nm, although lesser and greater thicknesses can also be employed.

The sacrificial gate layer 34 may include a semiconductor material such as, for example, amorphous silicon (a-Si) or polycrystalline silicon (polysilicon). The sacrificial gate layer 34 may be formed by a deposition process including, but not limited to, CVD, PVD or plasma enhanced chemical vapor deposition (PECVD). The thickness of the sacrificial gate layer 34 can be from 10 nm to 30 nm, although lesser and greater thicknesses can also be employed.

The dielectric capping layer 38 may include a dielectric oxide such as, for example, silicon dioxide, tetraethylorthosilicate (TEOS) oxide, high aspect ratio plasma (HARP) oxide, high temperature oxide (HTO) or high density plasma (HDP) oxide. The dielectric capping layer 38 can be formed, for example, by CVD, PVD or ALD. The thickness of the dielectric capping layer 38 can be from 50 nm to 100 nm, although lesser and greater thicknesses can also be employed.

Figure 7:
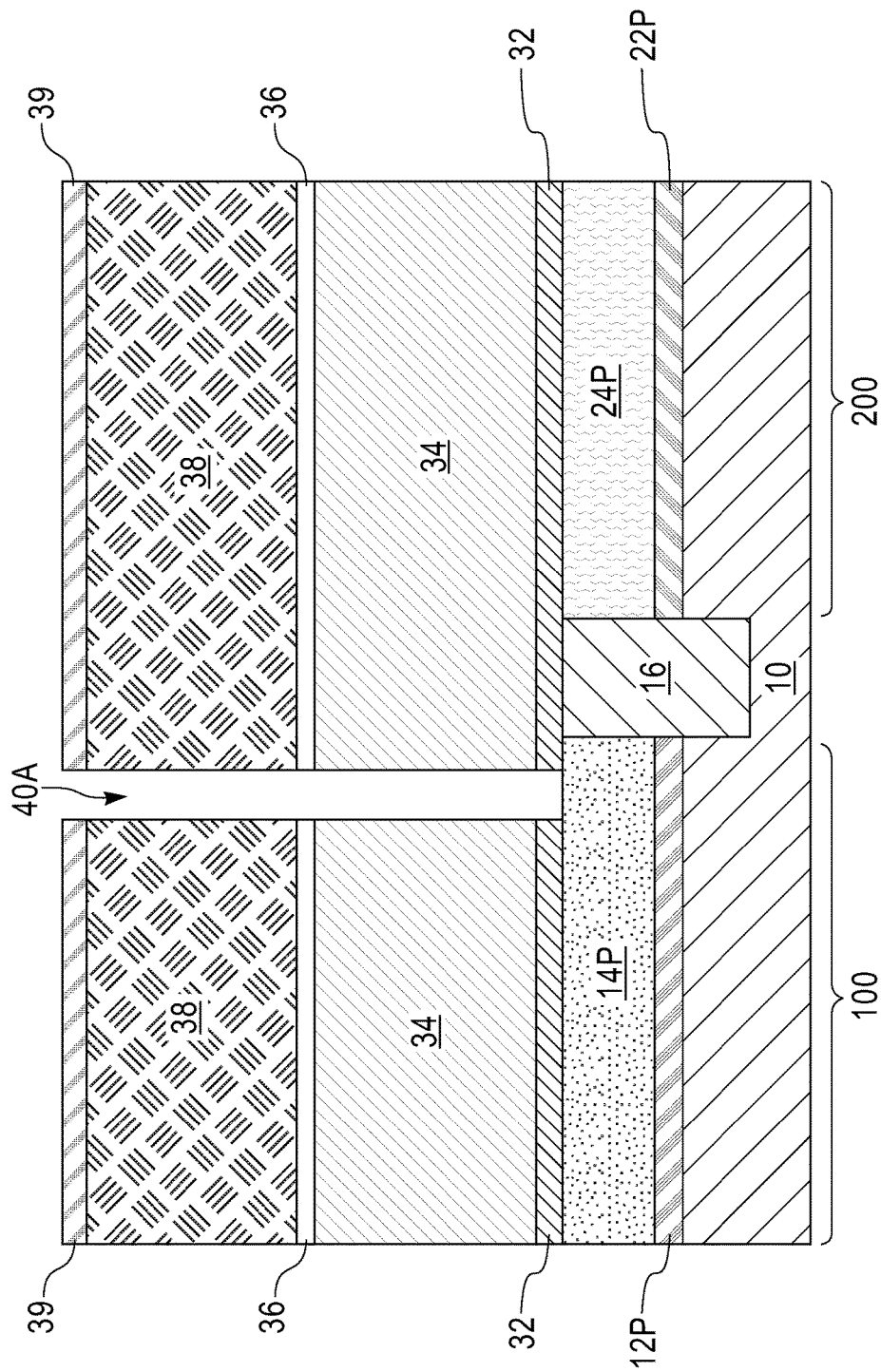
FIG. 7 is a cross-sectional view of the exemplary semiconductor structure of FIG. 6 after forming a first trench to expose a portion of the first doped bottom semiconductor portion using a second patterned mask layer as an etch mask.

Referring now to FIG. 7, there is illustrated the exemplary semiconductor structure of FIG. 6 after forming a first trench 40A extending through the material stack (32, 34, 36, 38), exposing a surface of the first doped bottom semiconductor portion 14P. The first trench 40A can be formed by applying a second mask layer (not shown) over the dielectric capping layer 38 and then lithographically patterning the second mask layer to form an opening therein. The opening exposes an area where the first trench 40A is subsequently formed. The second mask layer may be a photoresist layer or a photoresist layer in conjunction with hard mask layer(s). Remaining portions of the second mask layer are herein referred to as a second patterned mask layer 39. The pattern in the second mask layer is subsequently transferred into the dielectric capping layer 38, the second spacer layer 36, the sacrificial gate layer 34 and the first spacer layer 32 to form the first trench 40A. In one embodiment, multiple etching processes may be performed to sequentially remove portions of the dielectric capping layer 38, the second spacer layer 36, the sacrificial gate layer 34 and the first spacer layer 32 that are not covered by the second patterned mask layer 39. The etch can be an anisotropic etch such as, for example, RIE. The width the first trench 40A can be from 5 nm to 10 nm, although lesser and greater widths can also be employed.

Figure 8:
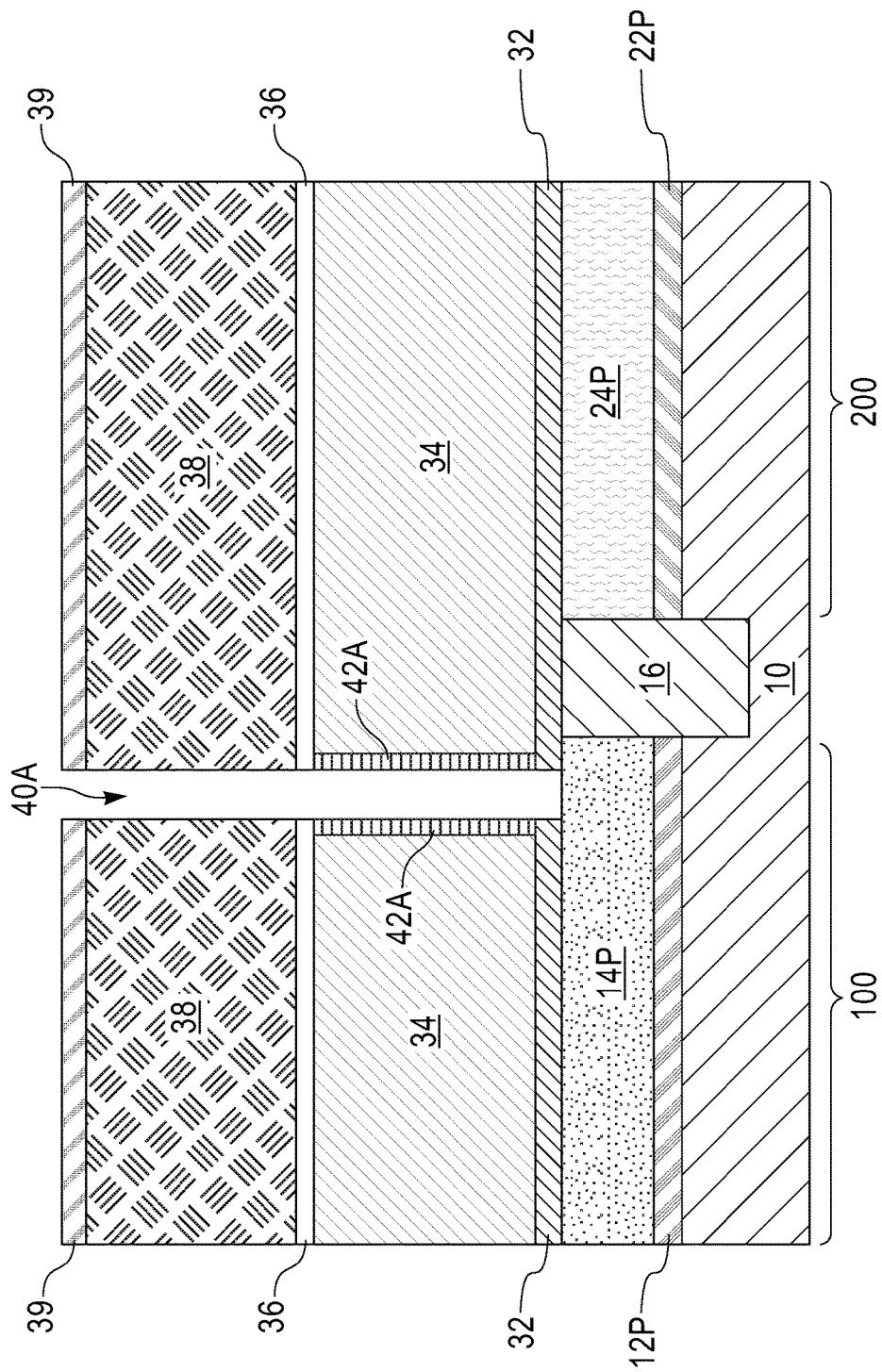
FIG. 8 is a cross-sectional view of the exemplary semiconductor structure of FIG. 7 after forming a first oxide layer on sidewalls of the sacrificial gate layer that are exposed by the first trench.

Referring now to FIG. 8, there is illustrated the exemplary semiconductor structure of FIG. 7 after forming a first oxide layer 42A on sidewalls of the sacrificial gate layer 34 that are exposed by the first trench 40A. The first oxide layer 42A may be formed by oxidizing the exposed portions of the sacrificial gate layer 34. The oxidation may be performed by a plasma oxidation process or other oxidation processes known in the art. In some embodiments of the present application, the oxidation process also oxidizes a portion of the first doped bottom semiconductor portion 14P at the bottom of the first trench 40A. Any oxides formed in this region are removed before performing epitaxial growth processes described in FIG. 9. The surface of the exposed portion of the first doped bottom semiconductor portion 14P thus is free of native oxide.

Figure 9:
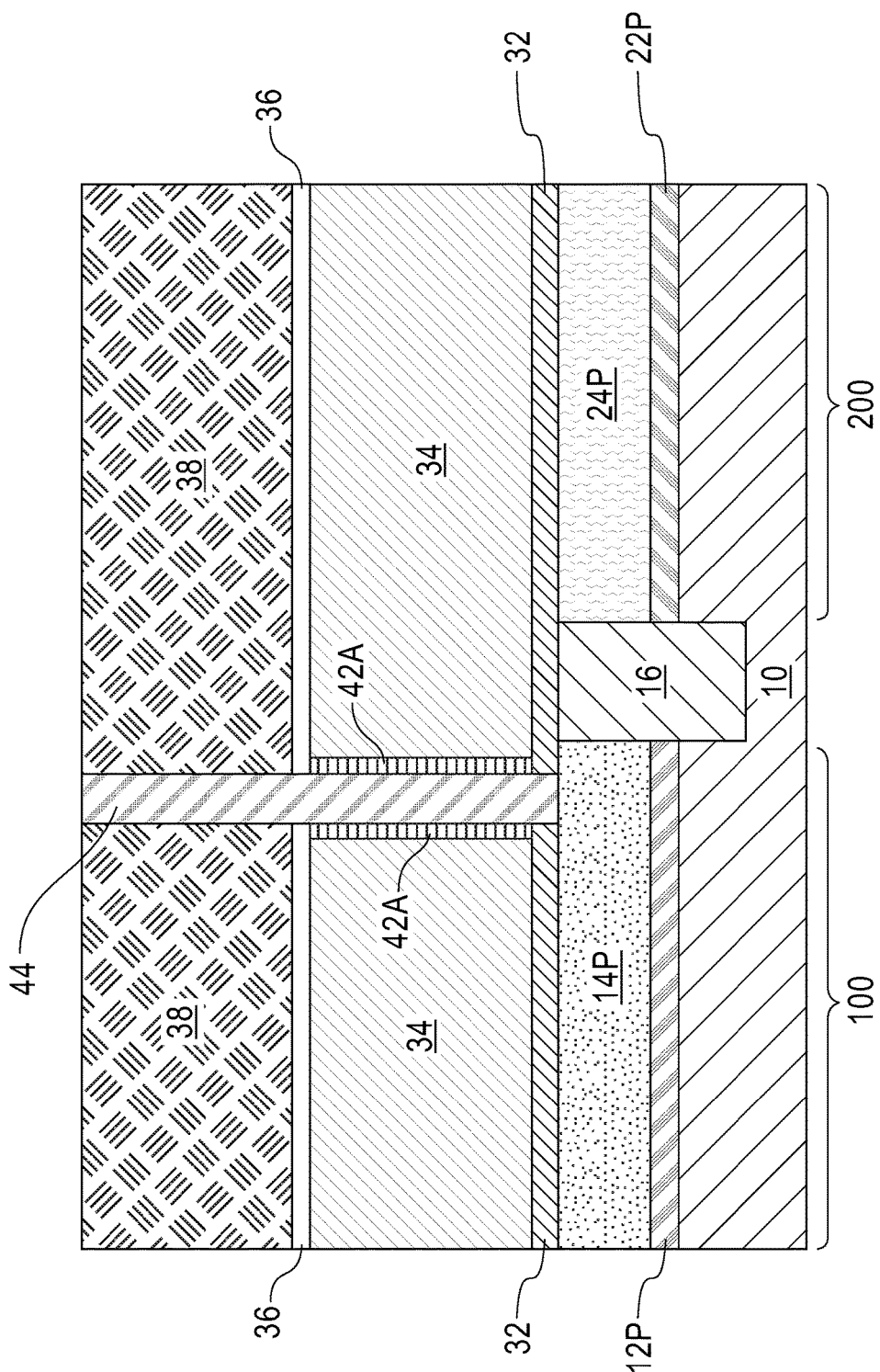
FIG. 9 is a cross-sectional view of the exemplary semiconductor structure of FIG. 8 after forming a first epitaxial semiconductor fin layer within the first trench.

Referring now to FIG. 9, there is illustrated the exemplary semiconductor structure of FIG. 8 after growing a first epitaxial semiconductor fin layer 44 from the exposed surface of the first doped bottom semiconductor portion 14P within the first trench 40A. The first epitaxial semiconductor fin layer 44 may include any semiconductor material as mentioned above for the semiconductor substrate 10. In one embodiment and when the first device region 100 is an n-type semiconductor device region, the first epitaxial semiconductor fin layer 44 may be composed of SiGe or a Group III-V compound semiconductor material such as for example, InAs, GaAs, InP or InGaAs.

The first epitaxial semiconductor fin layer 44 may be formed by a selective epitaxial growth process. The selective epitaxial growth process deposits the semiconductor material that provides the first epitaxial semiconductor fin layer 44 only on the semiconductor surface (i.e., the first doped bottom semiconductor portion 14P), but not on dielectric surfaces, such as the second patterned mask layer 39, the dielectric capping layer 38, the second spacer layer 36, the first oxide layer 42A and the first spacer layer 32. After the selective epitaxial growth process, a planarization process such as, for example, CMP may be performed to remove the excess semiconductor material that are deposited on the top surface of the second patterned mask layer 39 along with the second patterned mask layer 39. After planarization, the top surface of the first epitaxial semiconductor fin layer 44 is coplanar with the top surface of the dielectric capping layer 38.

Figure 10:
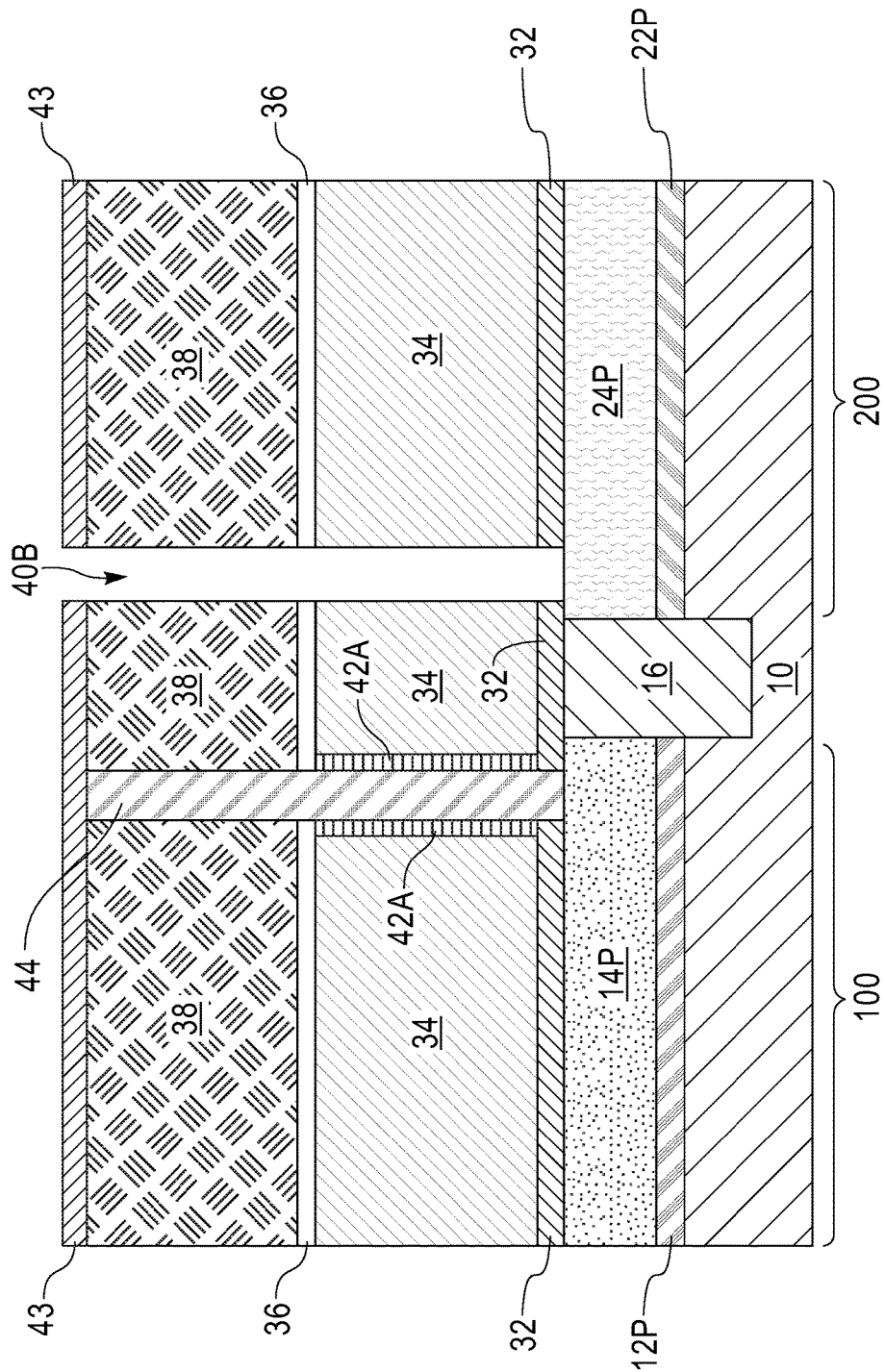
FIG. 10 is a cross-sectional view of the exemplary semiconductor structure of FIG. 9 after forming a second trench to expose a portion of the second doped bottom semiconductor portion using a third patterned mask layer as an etch mask.

Referring now to FIG. 10, there is illustrated the exemplary semiconductor structure of FIG. 9 after forming a second trench 40B extending through the material stack (32, 34, 36, 38), exposing a surface of the second doped bottom semiconductor portion 24P. The second trench 40B can be formed by performing processing steps described above in formation of the first trench 40A using a third patterned mask layer 43 as an etch mask.

Figure 11:
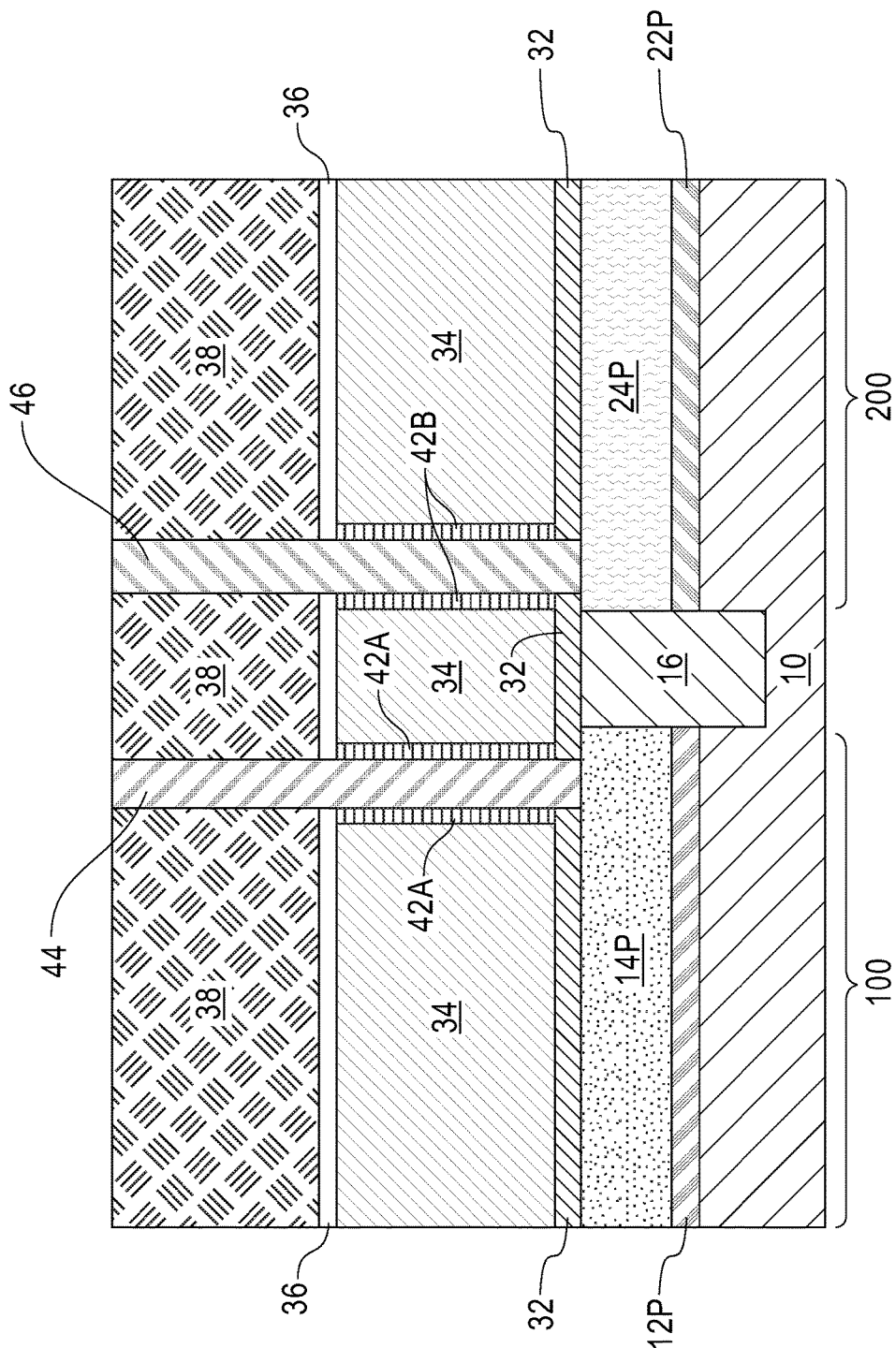
FIG. 11 is a cross-sectional view of the exemplary semiconductor structure of FIG. 10 after forming a second oxide layer on sidewalls of the sacrificial gate layer that are exposed by the second trench and forming a second epitaxial semiconductor fin layer within the second trench.

Referring now to FIG. 11, there is illustrated the exemplary semiconductor structure of FIG. 10 after forming a second oxide layer 42B on sidewalls of the sacrificial gate layer 34 that are exposed by the second trench 40B and forming a second epitaxial semiconductor fin layer 46 within the second trench 40B. The second oxide layer 42B and the second epitaxial semiconductor fin layer 46 can be formed by performing processing steps described above in formation of the first oxide layer 42A and the first epitaxial semiconductor fin layer 44, respectively. The third patterned mask layer 43 is subsequently removed after the formation of the first epitaxial semiconductor fin layer 46.

The second epitaxial semiconductor fin layer 46 may include any semiconductor material as mentioned above for the semiconductor substrate 10. In one embodiment and when the second device region 200 is a p-type semiconductor device region, the second epitaxial semiconductor fin layer 46 may be composed of silicon.

Figure 12:
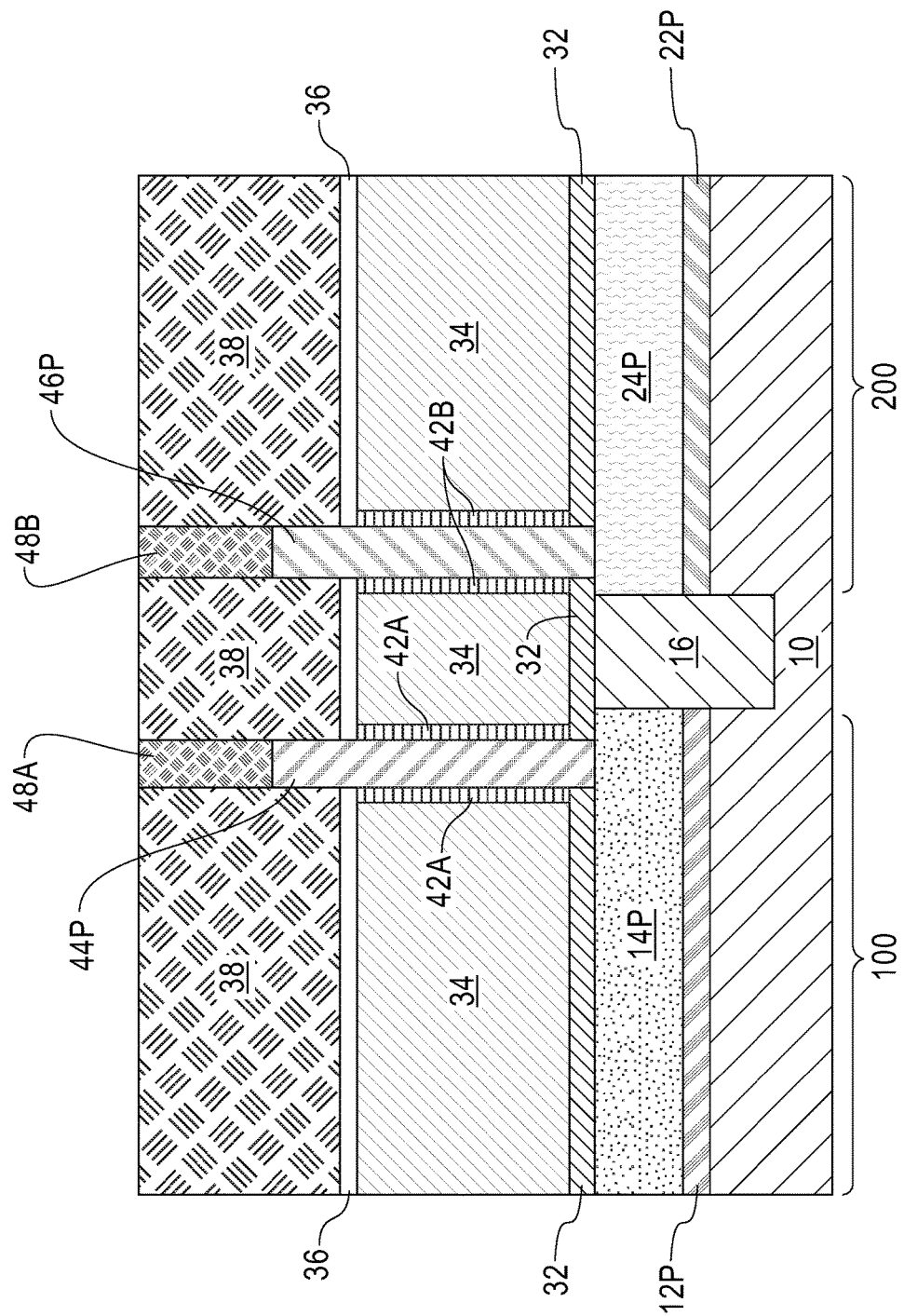
FIG. 12 is a cross-sectional view of the exemplary semiconductor structure of FIG. 11 after forming a first semiconductor fin and a second semiconductor fin, and forming a first dielectric cap atop the first semiconductor fin and a second dielectric cap atop the second semiconductor fin.

Referring now to FIG. 12, there is illustrated the exemplary semiconductor structure of FIG. 11 after recessing the first epitaxial semiconductor fin layer 44 and the second epitaxial semiconductor fin layer 46 to form a first semiconductor fin 44P and a second semiconductor fin 46P, and subsequently forming a first dielectric cap 48A atop the first semiconductor fin 44P and a second dielectric cap 48B atop the second semiconductor fin 46P.

The first epitaxial semiconductor fin layer 44 and the second epitaxial semiconductor fin layer 46 may be recessed by etching. In one embodiment, separate etching processes may be performed to recess the first semiconductor fin 44 and the second semiconductor fin 46. For example, a first etch can be performed to recess the first epitaxial semiconductor fin layer 44 selective to the dielectric capping layer 38 and the second epitaxial semiconductor fin layer 46. The first etch can be a dry etch such as RIE or a wet etch. Subsequently, a second etch can be performed to recess the second epitaxial semiconductor fin layer 46 selective to the dielectric capping layer 38 and the first semiconductor fin 44P. The second etch can be a dry etch such as RIE or a wet etch. After etching, a remaining portion of the first epitaxial semiconductor fin layer 44 constitutes the first semiconductor fin 44P, and a remaining portion of the second epitaxial semiconductor fin layer 46 constitutes the second semiconductor fin 46P. A top surface of each of the first semiconductor fin 44P and the second semiconductor fin 46P is located between the top surface of the dielectric capping layer 38 and the bottom surface of the dielectric capping layer 38. Thus, a first void (not shown) is formed over the first semiconductor fin 44P within the first trench 40A, and a second void (not shown) is formed over the second semiconductor fin 46P within the second trench 40B.

Next, a dielectric material is deposited to fill the first void and the second void. The dielectric material may be a dielectric oxide (e.g., silicon dioxide), a dielectric nitride (e.g., silicon nitride), a dielectric oxynitride, or any combination thereof. The dielectric material may be deposited by a deposition process such as, for example, CVD or PVD. After deposition, the excess dielectric material can be removed from the top surface of the dielectric capping layer 38 by a planarization process such as, for example, by CMP, thus providing the first dielectric cap 48A and the second dielectric cap 48B. A top surface of each of the first dielectric cap 48A and the second dielectric cap 48B is coplanar with the top surface of the dielectric capping layer 38.

Figure 13:
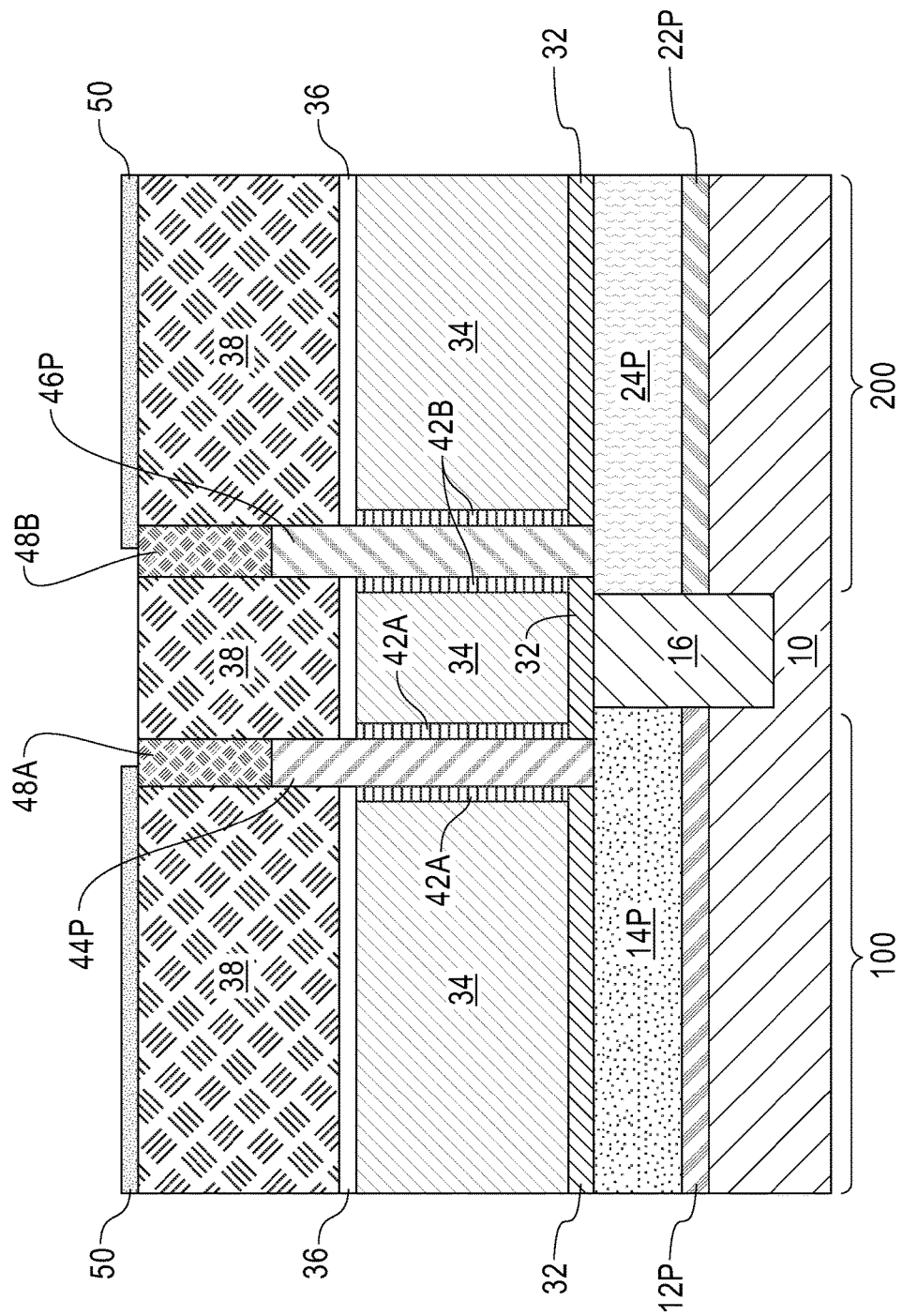
FIG. 13 is a cross-sectional view of the exemplary semiconductor structure of FIG. 12 after forming a fourth patterned mask layer.

Referring now to FIG. 13, there is illustrated the exemplary semiconductor structure of FIG. 12 after forming a fourth patterned mask layer 50 over the dielectric capping layer 38, the first dielectric cap 48A and the second dielectric cap 48B. The fourth patterned mask layer 50 contains an opening that exposes a region between the first semiconductor fin 44P and the second semiconductor fin 46P.

The fourth patterned mask layer 50 can be formed by applying a fourth mask layer (not shown) over the dielectric capping layer 38, the first dielectric cap 48A and the second dielectric cap 48B and lithographically patterning the fourth mask layer. The fourth mask layer may be a photoresist layer or a photoresist layer in conjunction with hard mask layer(s). Remaining portions of the fourth mask layer constitutes the fourth patterned mask layer 50.

In some embodiments of the present application and as shown, due to the mask misalignment, the fourth patterned mask layer 50 may overlie distal sidewalls of the first semiconductor fin 44P and the second semiconductor fin 46P, but not overlie proximal sidewalls of the first semiconductor fin 44P and the second semiconductor fin 46P. As used herein, for each parallel pair of semiconductor fins that are laterally spaced from each other along a widthwise direction of the semiconductor fins, distal sidewalls of the pair of semiconductor fins refers to two outer lengthwise sidewalls of the pair of semiconductor fins. As used herein, for each parallel pair of semiconductor fins that are laterally spaced from each other along a widthwise direction of the semiconductor fins, proximal sidewalls of the pair of semiconductor fins refers to two inner lengthwise sidewalls of the pair of semiconductor fins.

Figure 14:
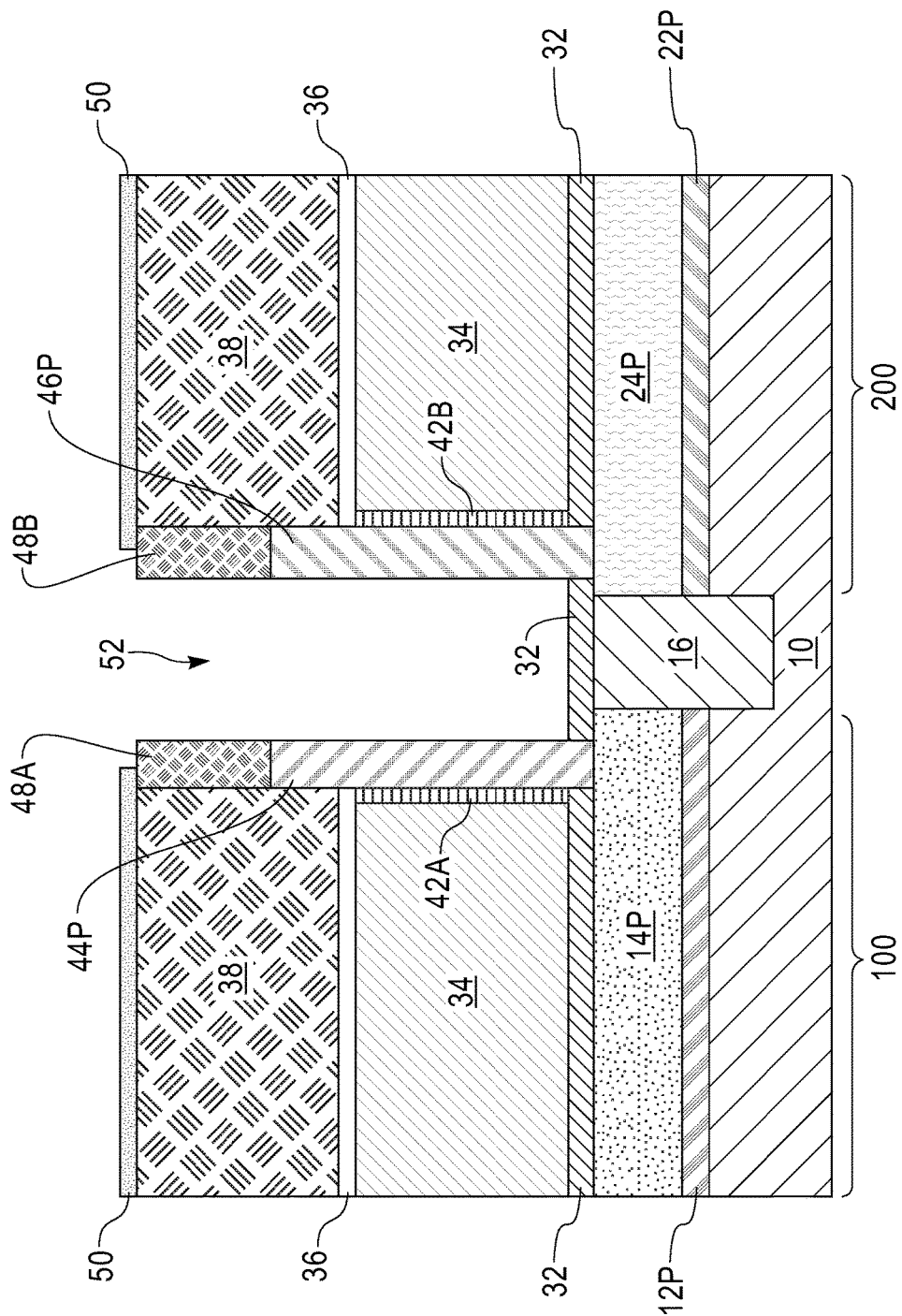
FIG. 14 is a cross-sectional view of the exemplary semiconductor structure of FIG. 13 after forming an opening by removing portions of the dielectric capping layer, the second spacer layer, the sacrificial gate layer, the first oxide layer and the second oxide layer located between the first semiconductor fin and the second semiconductor fin.

Referring to FIG. 14, there is illustrated the exemplary semiconductor structure of FIG. 13 after removing physically exposed portions of the dielectric capping layer 38, the second spacer layer 36, the sacrificial gate layer 34, the first oxide layer 42A and the second oxide layer 42B that are located between the first and second semiconductor fins 44P, 46P by one or more anisotropic etching processes. The anisotropic etching process can be a dry etch such as, for example, RIE or a wet etch. After etching, an opening 52 is formed exposing a top surface of a portion of the first spacer layer 32 located between the first semiconductor fin 44P and the second semiconductor fin 46P. The opening 52 also exposes proximal sidewalls of the first semiconductor fin 44P and the second semiconductor fin 46P as well as proximal sidewalls of the first dielectric caps 48A and the second dielectric aps 48B.

Figure 15:
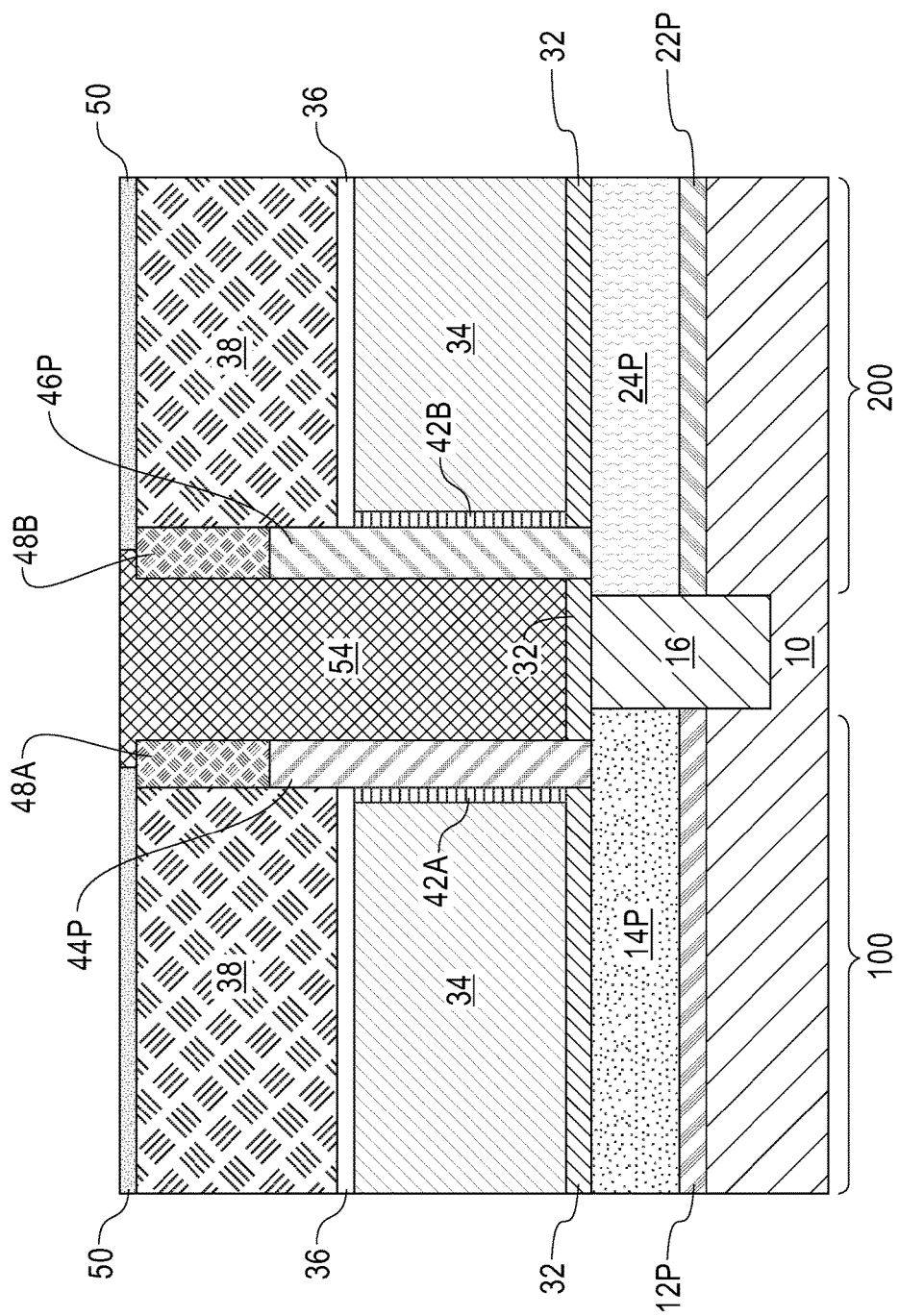
FIG. 15 is a cross-sectional view of the exemplary semiconductor structure of FIG. 14 after forming a dielectric fill layer to completely fill the opening.

Referring to FIG. 15, there is illustrated the exemplary semiconductor structure of FIG. 14 after forming a dielectric fill layer 54 to completely fill the opening 52. The dielectric fill layer 54 may include a dielectric oxide such as, for example, silicon dioxide, a flowable oxide or a HARP oxide. The dielectric fill layer 54 may be formed by a deposition process such as, for example, CVD or PVD. After deposition, the dielectric fill layer 54 may be thermally annealed to densify the dielectric fill layer 54. In some embodiments, UV curing and/or a low radio frequency plasma treatment may be used instead of thermal annealing or in conjunction with thermal annealing to densify the dielectric fill layer 54.

Subsequently, a planarization process can be performed to planarize the dielectric fill layer 54, which stops on the fourth patterned mask layer 50. The planarization process may include, for example, CMP.

Figure 16:
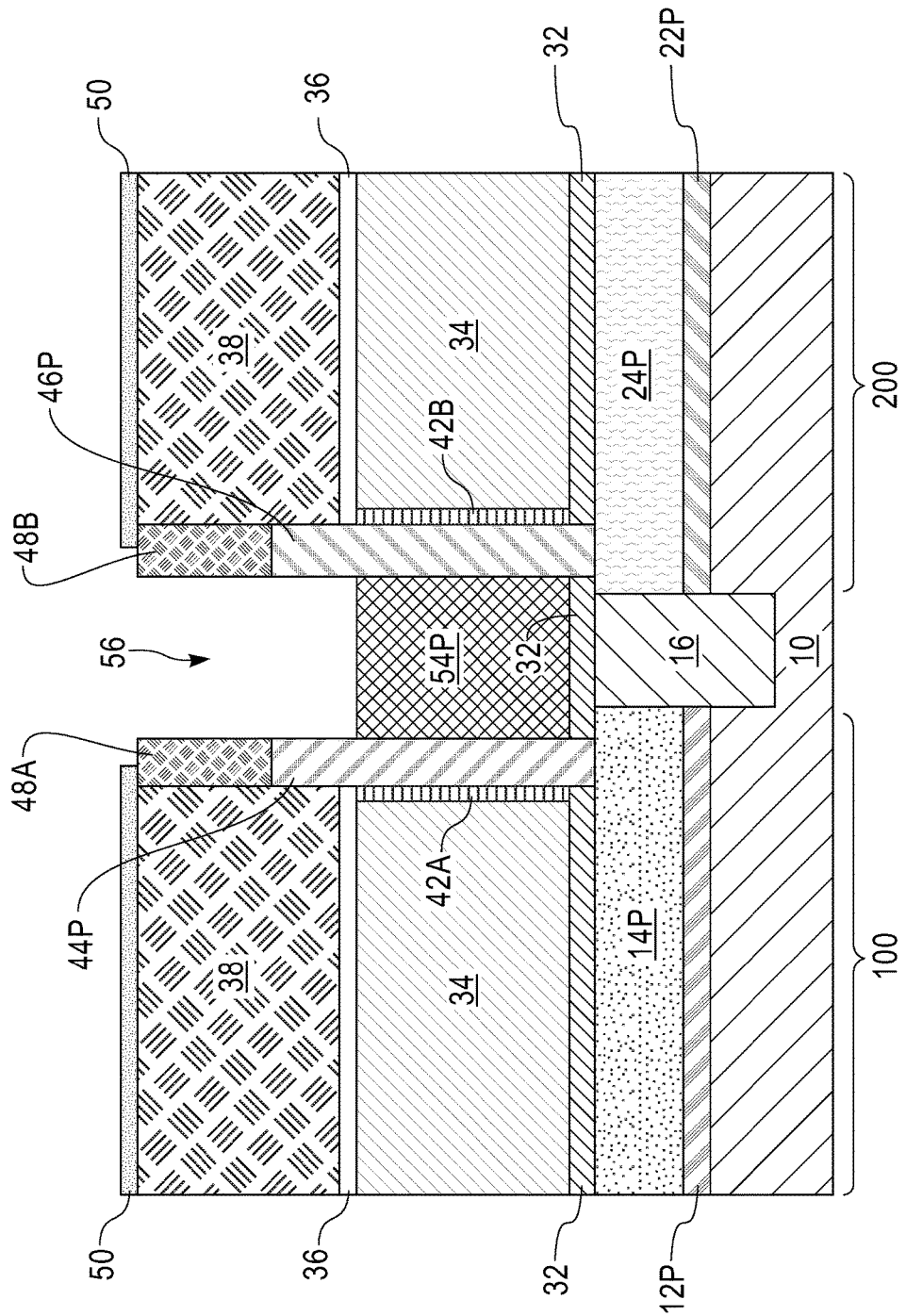
FIG. 16 is a cross-sectional view of the exemplary semiconductor structure of FIG. 15 after recessing the dielectric fill layer to provide a dielectric fill portion and a void above the dielectric fill portion.

Referring to FIG. 16, there is illustrated the exemplary semiconductor structure of FIG. 15 after recessing the dielectric fill layer 54 to provide a dielectric fill portion 54P. The dielectric fill layer 54 may be recessed by a recess etch that removes the dielectric material of the dielectric fill layer 54 selective to dielectric material of the first and second dielectric caps 48A, 48B and the semiconductor materials of the first and second semiconductor fins 44P, 46P. The recess etch can be a dry etch such as, for example, RIE or a wet etch. The recess etch is controlled such that after etching, a top surface of the dielectric fill portion 54P is located below the top surface of the second spacer layer 36. In one embodiment and as shown, the top surface of the dielectric fill portion 54P is coplanar with a top surface of the sacrificial gate layer 34. After the recess etch, a void 56 is formed above the dielectric fill portion 54P. The fourth patterned mask layer 50 can be subsequently removed, for example, by oxygen-based plasma etching.

Figure 17:
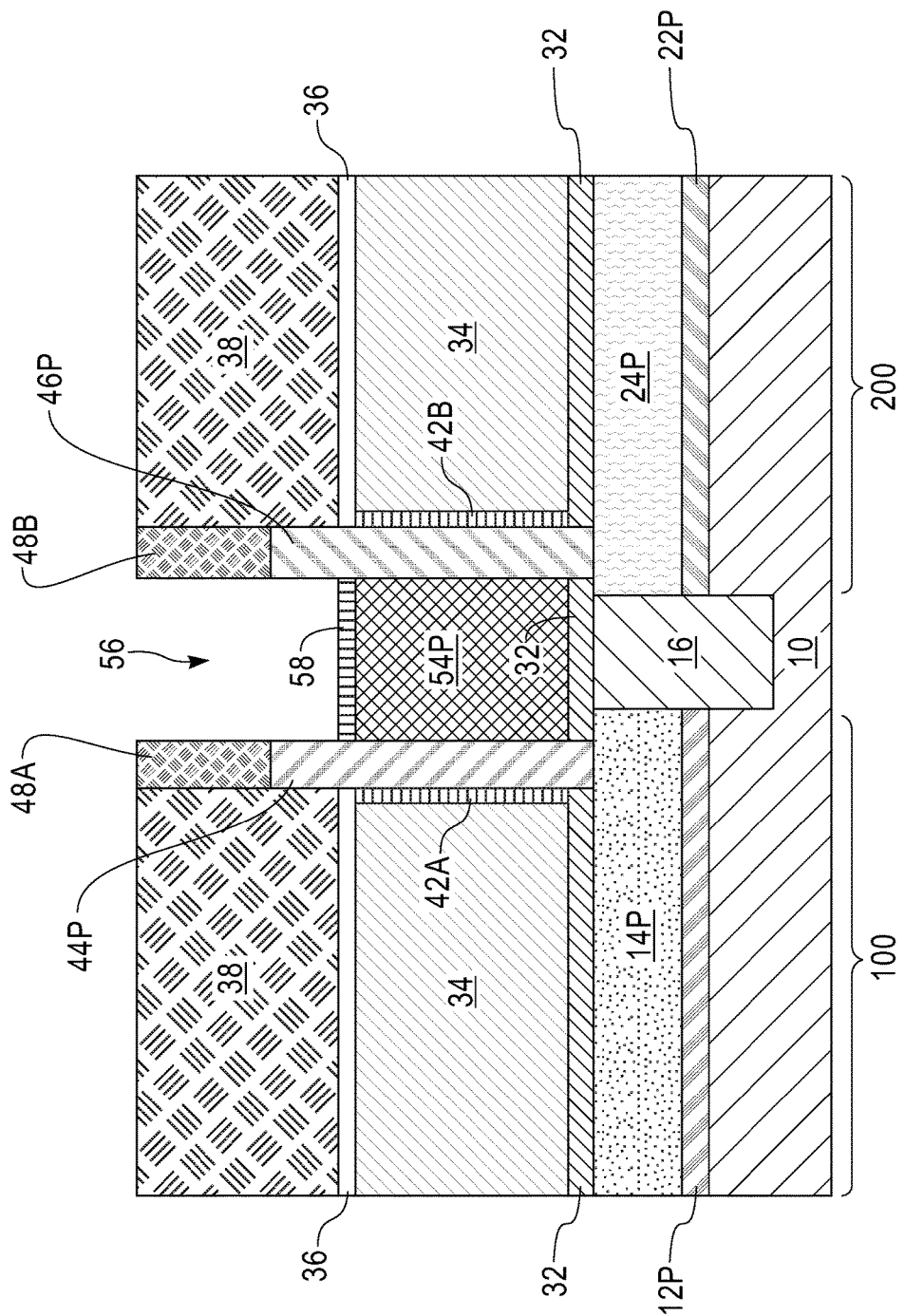
FIG. 17 is a cross-sectional view of the exemplary semiconductor structure of FIG. 16 after forming a third spacer over the dielectric fill portion.

Referring to FIG. 17, there is illustrated the exemplary semiconductor structure of FIG. 16 after forming a third spacer 58 over the dielectric fill portion 54P. The third spacer 58 has a top surface coplanar with the top surface of the second spacer layer 36. The third spacer 58 may include a dielectric material the same as, or different from the dielectric material that provides the second spacer layer 36. For example, the third spacer 58 may include silicon dioxide, silicon nitride, SiOCN or SiBCN. The third spacer 58 may be formed by a directional deposition of a dielectric material over the dielectric fill portion 54P, the first and second dielectric caps 48A, 48 and the dielectric capping layer 38. The dielectric material that is deposited on the top surfaces of the dielectric capping layer 38 and the first and second dielectric caps 48A, 48B can be removed by a planarization process such as, for example, CMP.

Figure 18:
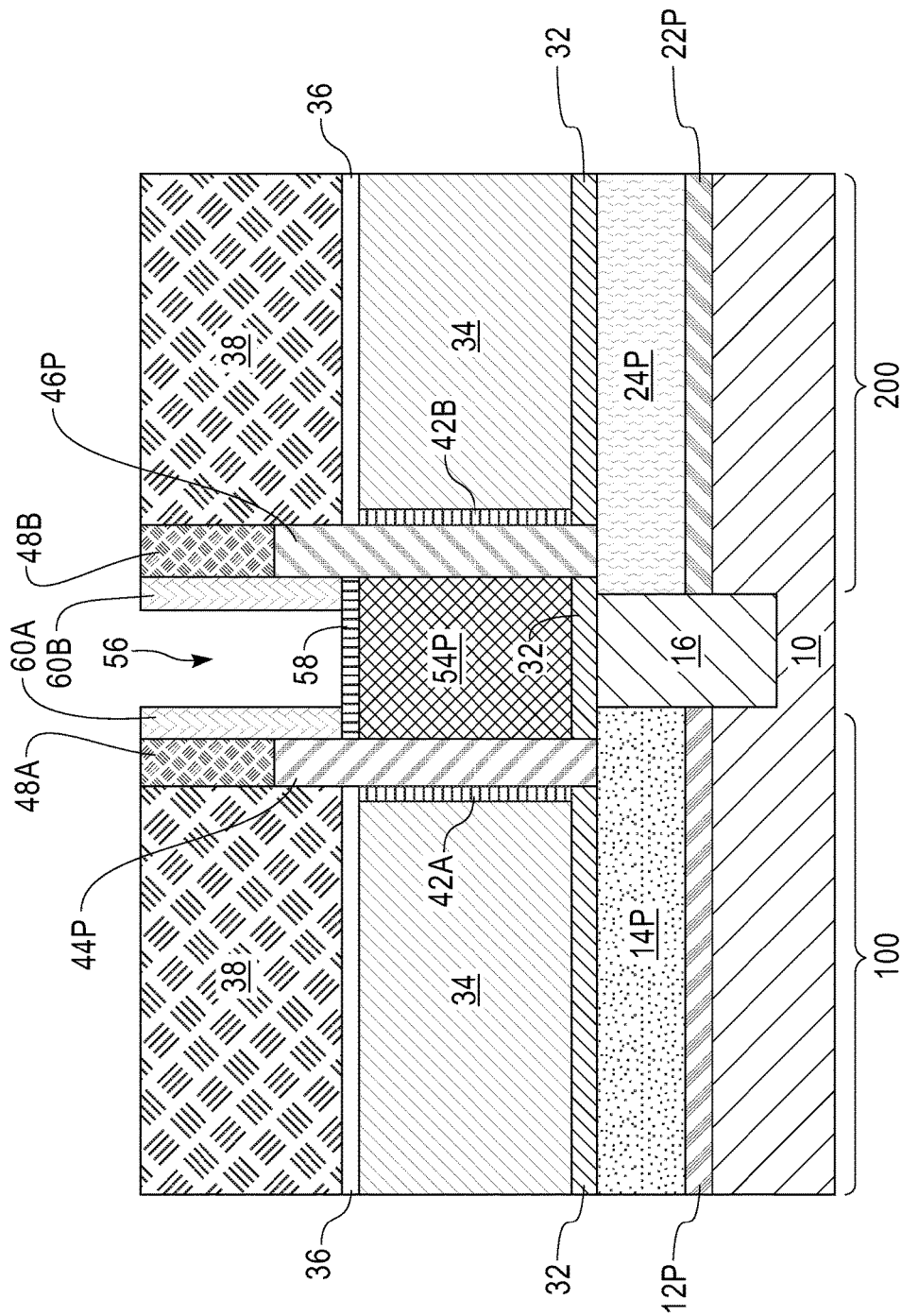
FIG. 18 is a cross-sectional view of the exemplary semiconductor structure of FIG. 17 after forming a first sacrificial sidewall spacer and a second sacrificial sidewall spacer on proximal sidewall surfaces of the first dielectric cap and the first semiconductor fin as well as proximal sidewall surfaces of the second dielectric cap and the second semiconductor fin that are exposed by the void, respectively.

Referring to FIG. 18, there is illustrated the exemplary semiconductor structure of FIG. 17 after forming a first sacrificial sidewall spacer 60A on physically exposed inner lengthwise sidewall (i.e., proximal sidewall) surfaces of the first dielectric cap 48A and the first semiconductor fin 44P and a second sacrificial sidewall spacer 60B on physically exposed inner lengthwise sidewall (i.e., proximal sidewall) surfaces of the second dielectric cap 48B and the second semiconductor fin 46P. The first and second sacrificial sidewall spacers 60A, 60B may include a dielectric material that can be selectively removed with respect to the second spacer layer 36 and the third spacer 58. In one embodiment, each of the first and second sacrificial sidewall spacers 60A, 60B may include a dielectric nitride such as, for example, silicon nitride. The first and second sacrificial sidewall spacers 60A, 60B may be formed by conformally depositing a dielectric material on the bottom and sidewall surfaces of the void 56 and on top surfaces of the first and second dielectric caps 48A, 48B and the dielectric capping layer 38. Horizontal portions of the deposited dielectric material are subsequently removed, for example, by an anisotropic etch. The anisotropic etch can be a dry etch such as, for example, RIE or a wet etch. After etching, remaining vertical portions of the deposited dielectric material present on the sidewall surfaces of the void 56 constitutes the first and second sacrificial sidewall spacers 60A, 60B. The width of each of the first and second sacrificial sidewall spacers 60A, 60B, as measured from its base, can be from 5 nm to 25 nm, although lesser and greater widths can also be employed. As shown, a bottom surface of each of the first and second sacrificial sidewall spacer 60A, 60B is in direct contact with a top surface of the third spacer 58.

Figure 19:
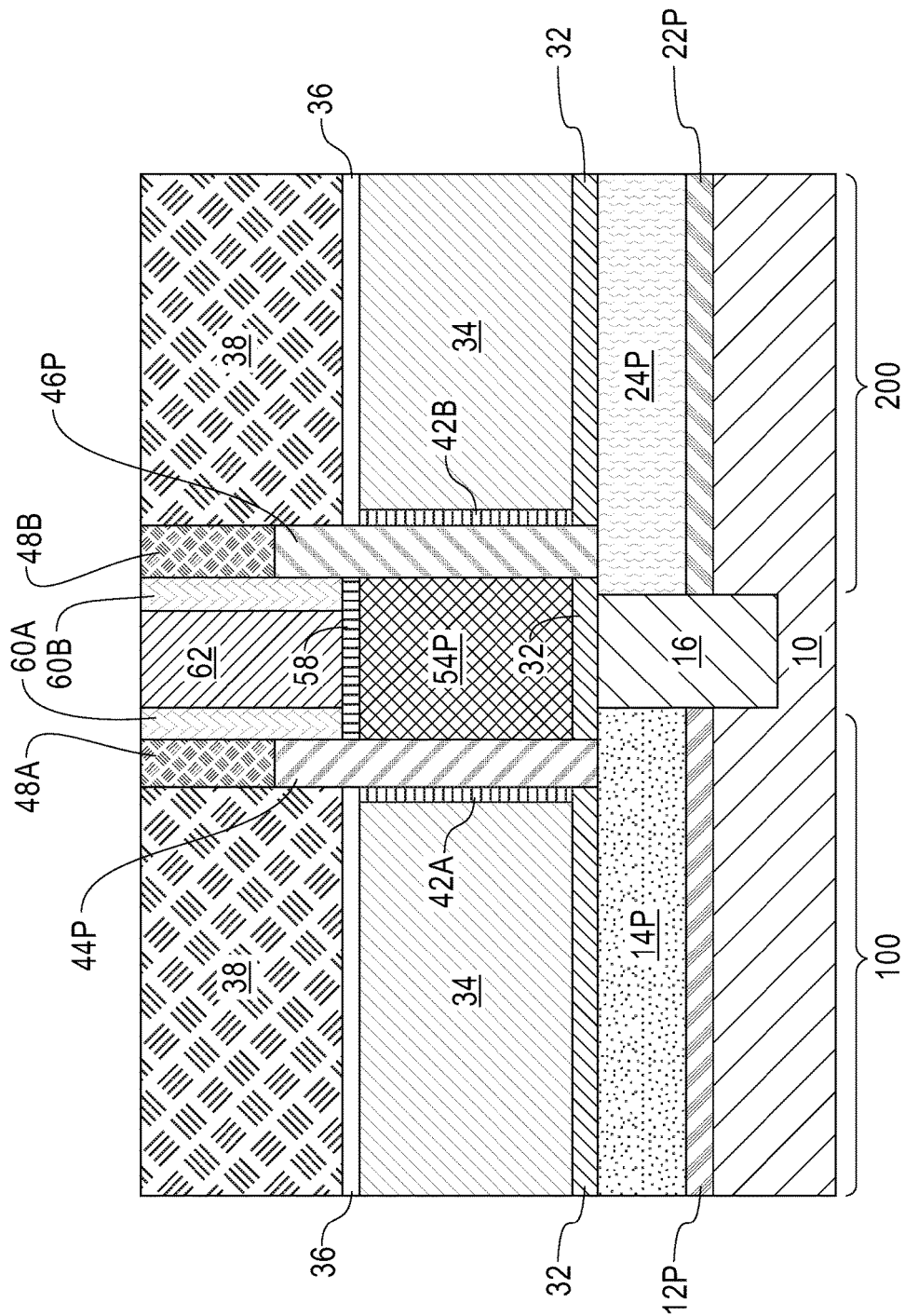
FIG. 19 is a cross-sectional view of the exemplary semiconductor structure of FIG. 18 after forming an interlevel dielectric (ILD) fill portion to completely fill the void.

Referring to FIG. 19, there is illustrated the exemplary semiconductor structure of FIG. 18 after forming an inter-level dielectric (ILD) fill portion 62 to completely fill the void 56. The ILD fill portion 62 may be formed from, for example, a low-k dielectric material (with k<4.0), including but not limited to, silicon oxide, spin-on-glass, a flowable oxide, a high density plasma oxide, borophosphosilicate glass (BPSG) or any combination thereof. The ILD fill portion 62 may be deposited, for example, by CVD, PVD or spin coating. The ILD fill portion 62 can be initially formed such that an entirety of the top surface of the ILD fill portion 62 is formed above the top surface of the dielectric capping layer 38. The ILD fill portion 62 can be subsequently planarized, for example, by CMP and/or a recess etch using the dielectric capping layer 38 as a polishing and/or an etch stop. After planarization, the top surface of the ILD fill portion 62 is coplanar with the top surface of the dielectric capping layer 38.

Figure 20:
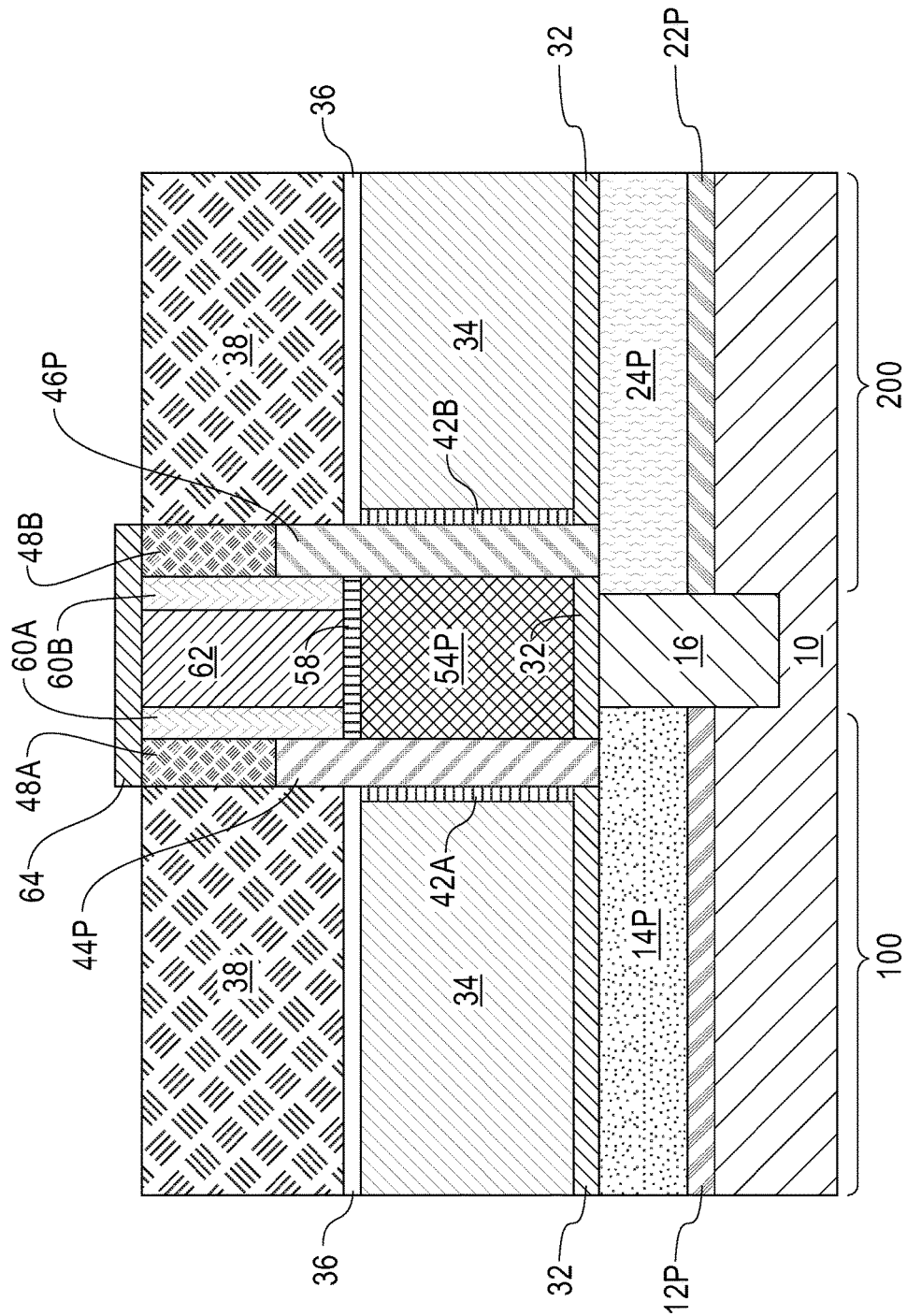
FIG. 20 is a cross-sectional view of the exemplary semiconductor structure of FIG. 19 after forming a fifth patterned mask layer covering the first dielectric cap and the second dielectric cap and a region therebetween.

Referring to FIG. 20, there is illustrated the exemplary semiconductor structure of FIG. 19 after forming a fifth patterned mask layer 64 over the first and second dielectric caps 48A, 48B, the first and second sacrificial sidewall spacers 60A, 60B and the ILD fill portion 62. The fifth patterned mask layer 64 can be formed by applying a fifth mask layer (not shown) over the dielectric capping layer 38, the first and second dielectric caps 48A, 48B, the first and second sacrificial sidewall spacers 60A, 60B and the ILD fill portion 62, and lithographically patterning the fifth mask layer. The pattern in the fifth patterned mask layer 64 can be selected such that the fifth patterned mask layer 64 covers all areas of the first semiconductor fin 44P, the second semiconductor fin 46P and the region therebetween, while exposing the dielectric capping layer 38.

Figure 21:
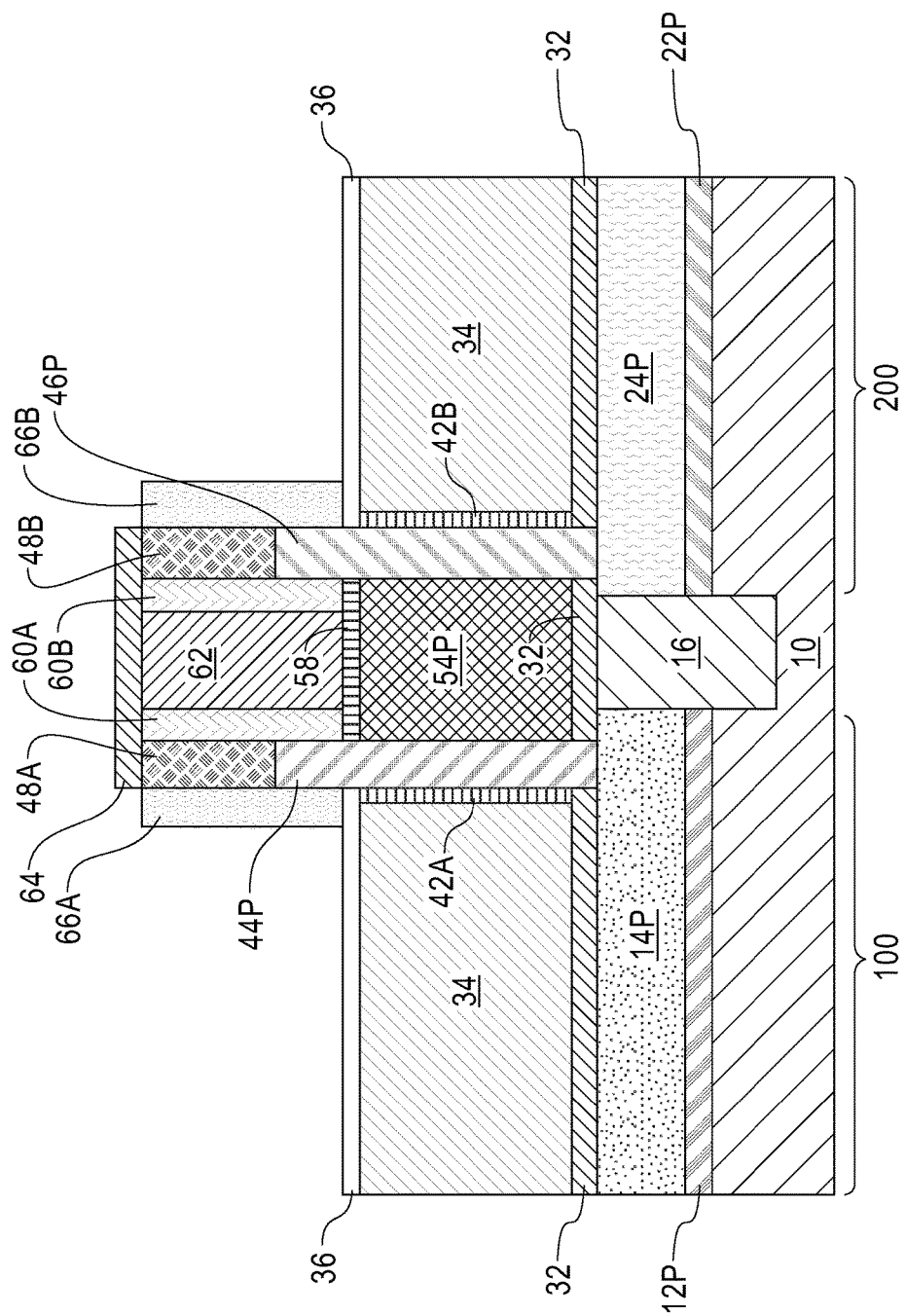
FIG. 21 is a cross-sectional view of the exemplary semiconductor structure of FIG. 20 after removing the dielectric capping layer, and forming a third sacrificial sidewall spacer and a fourth sacrificial sidewall spacer on physically exposed sidewall surfaces of the first semiconductor fin and the first dielectric cap as well as physically exposed sidewall surfaces of the second semiconductor fin and the second dielectric cap, respectively.

Referring to FIG. 21, there is illustrated the exemplary semiconductor structure of FIG. 20 after removing the dielectric capping layer 38 and forming a third sacrificial sidewall spacer 66A on physically exposed sidewall surfaces of the first semiconductor fin 44P and the first dielectric cap 48A and a fourth sacrificial sidewall spacer 66A on physically exposed sidewall surfaces of the second semiconductor fin 46P and the second dielectric cap 48B. A bottom surface of each of the third and fourth sacrificial sidewall spacers 66A, 66B is in direct contact with the top surface of the second spacer layer 36.

The dielectric capping layer 38 may be removed by an anisotropic etch that removes the dielectric material that provides the dielectric capping layer 38 selective to dielectric materials that provide the second spacer layer 36 and the first and second dielectric caps 48A, 48B and semiconductor material that provides the first and second semiconductor fins 44P, 46P. The removal of the dielectric capping layer 38 exposes outer lengthwise sidewalls and widthwise sidewalls of the first and second dielectric caps 48A, 48B and outer lengthwise sidewalls and widthwise sidewalls of a top portion of each of the first and second semiconductor fins 44P, 46P that were previously covered by the dielectric capping layer 38.

Subsequently, the third and fourth sacrificial sidewall pacers 66A, 66B are formed on the exposed sidewall surfaces of the first and second dielectric caps 48A, 48B and the first and second semiconductor fins 44P, 46P by performing the processing steps described above in formation of the first and second sacrificial sidewall spacers 60A, 60B. Each of the third and fourth sacrificial sidewall spacer 66A, 66B may include a dielectric the same as, or different from, the dielectric material that provides the first and second sacrificial sidewall spacer 60A, 60B. In one embodiment, each of the sacrificial sidewall spacers 60A, 60B, 66A, 66B is composed of silicon nitride.

Figure 22:
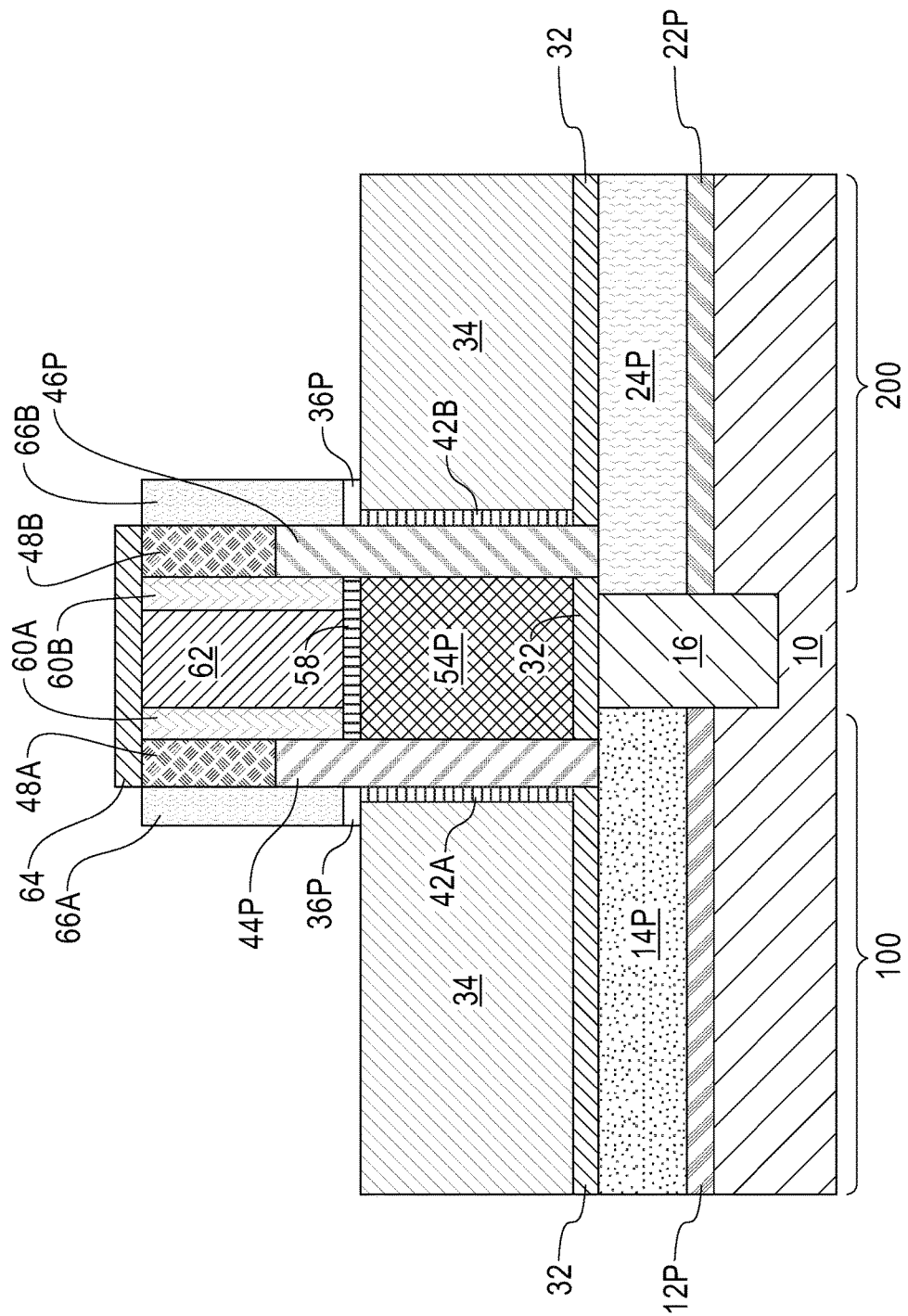
FIG. 22 is a cross-sectional view of the exemplary semiconductor structure of FIG. 21 after forming a second spacer beneath each of the third sacrificial sidewall spacer and the fourth sacrificial sidewall spacer.

Referring to FIG. 22, there is illustrated the exemplary semiconductor structure of FIG. 21 after removing portions of the second spacer layer 36 that are not covered by the third sacrificial sidewall spacer 66A and the fourth sacrificial sidewall spacer 66B. The physically exposed portions of the second spacer layer 36 may be removed by an anisotropic etch. The anisotropic etch can be a dry etch such as, for example, RIE or a wet etch that removes the dielectric material that provides the second spacer layer 36 selective to the dielectric material that provides the third sacrificial sidewall spacer 66A and the fourth sacrificial sidewall spacer 66B and the semiconductor material that provides the sacrificial gate layer 34. After etching, a remaining portion of the second spacer layer 36 beneath one of the third and fourth sacrificial sidewall spacers 66A, 66B constitutes a second spacer 36P. The removal of the exposed portions of the second spacer layer 36 exposes the sacrificial gate layer 34.

Figure 23:
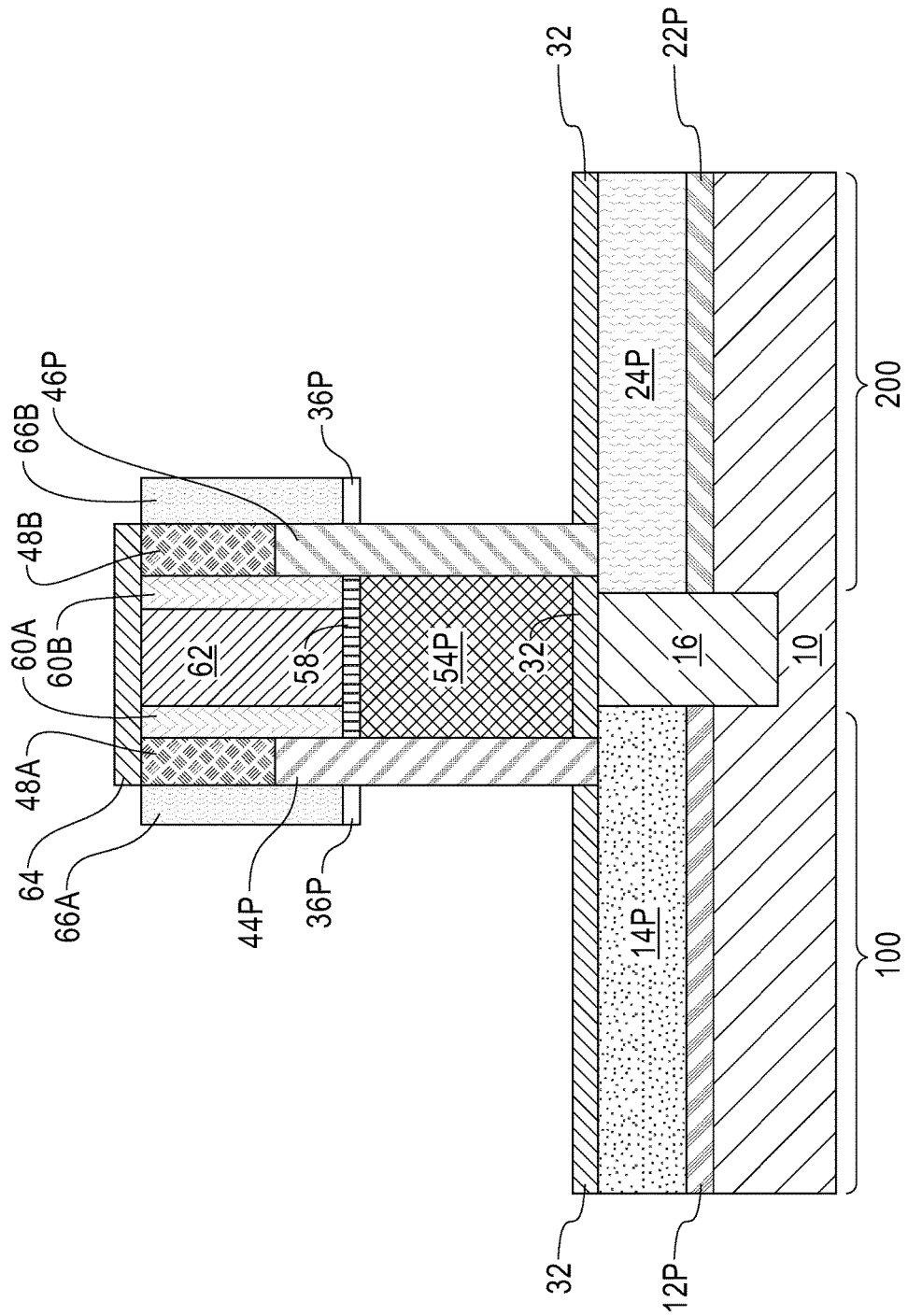
FIG. 23 is a cross-sectional view of the exemplary semiconductor structure of FIG. 22 after removing the sacrificial gate layer, the first oxide layer and the second oxide layer.

Referring to FIG. 23, there is illustrated the exemplary semiconductor structure of FIG. 22 after removing the sacrificial gate layer 34 and removing the first oxide layer 42A from sidewalls of the first semiconductor fin 44P and the second oxide layer 42B from sidewalls of the second semiconductor fin 46P.

The sacrificial gate layer 34 may be removed by an isotropic etch which can be a dry etch or a wet etch. In one embodiment, a wet etch including hot ammonia is employed to remove the sacrificial gate layer 34. The removal of the sacrificial gate layer 34 exposes the first oxide layer 42A present on sidewalls of the first semiconductor fin 44P and the second oxide layer 42B present on the sidewalls of the second semiconductor fin 46P Subsequently, physically exposed first oxide layer 42A and second oxide layer 42B are removed by an isotropic etch. The etch can be a dry etch such as, for example, RIE or a wet etch that removes the oxide of the first oxide layer 42A and the oxide of the second oxide layer 42B selective to the dielectric materials of the third and fourth sacrificial sidewall spacers 66A, 66B, the second spacers 36P and the first spacer layer 32 as well as the semiconductor materials of the first and second semiconductor fins 44P, 46P. The removal of the first oxide layer 42A exposes the outer lengthwise sidewall and widthwise sidewalls of a channel portion of the first semiconductor fin 44P that were previously covered by the first oxide layer 42A, while the removal of the second oxide layer 42B exposes the outer lengthwise sidewall and widthwise sidewalls of a channel portion of the second semiconductor fin 46P that were previously covered by the second oxide layer 42.

Figure 24:
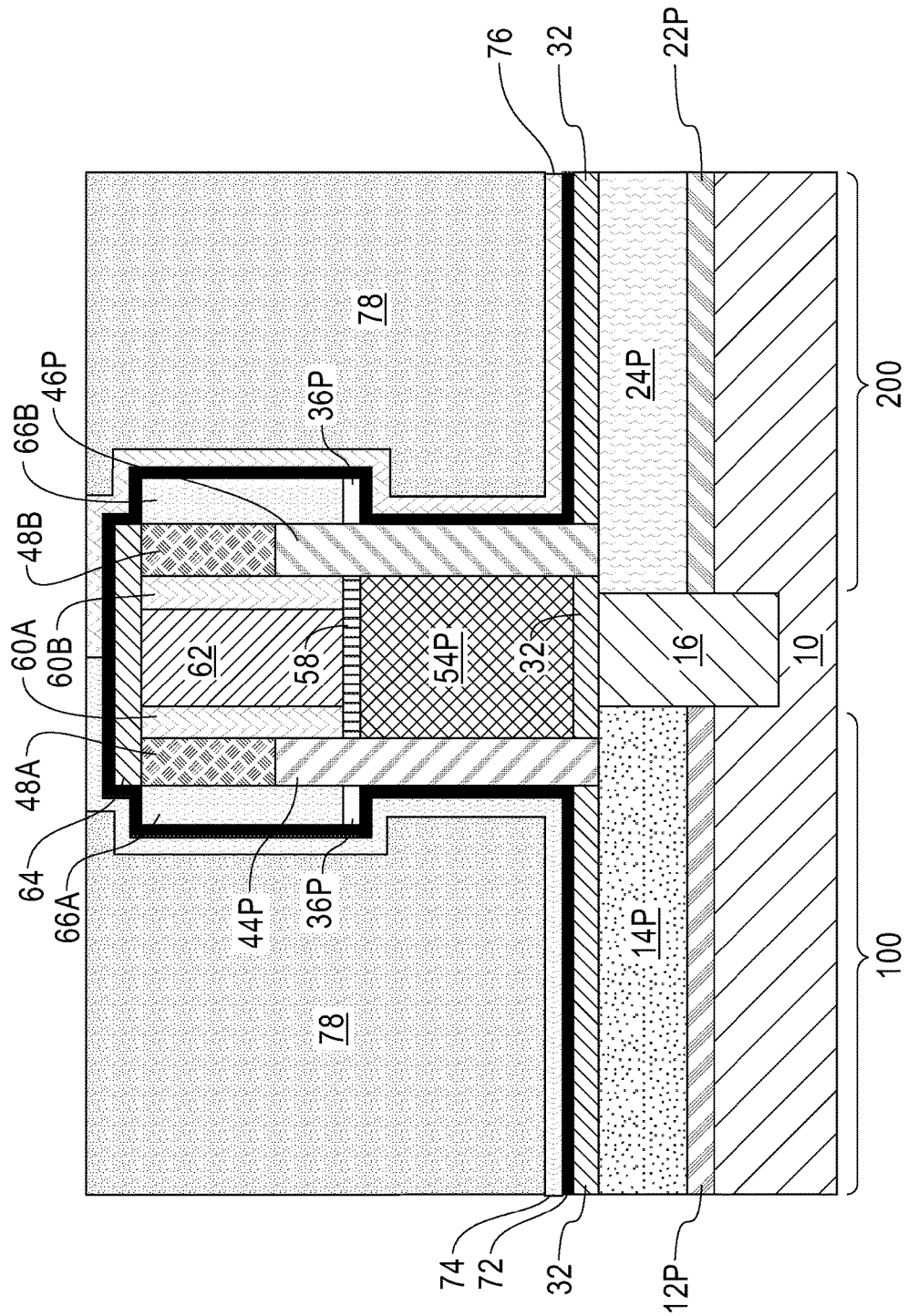
FIG. 24 is a cross-sectional view of the exemplary semiconductor structure of FIG. 23 after forming a gate dielectric layer, a first work function metal layer on a portion of the gate dielectric layer located in the first device region, a second work functional metal layer in another portion of the gate dielectric layer located in the second device region, and a gate electrode layer on the first and second work function metal layers.

Referring to FIG. 24, there is illustrated the exemplary semiconductor structure of FIG. 23 after forming a gate dielectric layer 72 on exposed surfaces of the fifth patterned mask layer 64, the third and fourth sacrificial sidewall spacers 66A, 66B, the second spacers 36P, the first and second semiconductor fins 44P, 46P and the first spacer layer 32, forming a first work function metal layer 74 on a portion of the gate dielectric layer 72 located in the first device region 100, forming a second work functional metal layer 76 on another portion of the gate dielectric layer 72 located in the second device region 200, and forming a gate electrode layer 78 on the first and second work function metal layers 74, 76.

The gate dielectric layer 72 may include a high-k dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multiple gate dielectric layers comprising different gate dielectric materials, e.g. silicon oxide, and a high-k gate dielectric material can be formed. The gate dielectric layer 72 may be formed by any deposition technique including, for example, CVD, PECVD, PVD and ALD. The thickness of the gate dielectric layer 72 can be from 1 nm to 10 nm, although lesser and greater thicknesses can also be employed.

The type of work function metal(s) that can be employed in the work function metal layer depends on the type of transistor formed. In one embodiment and when the first device region 100 is an n-type semiconductor device region and the second device region 200 is a p-type semiconductor device region, the first work function metal layer 74 includes an n-type work function metal such as, for example, Hf, Ti, Zr, Cd, La, Tl, Yb, Al, Ce, Eu, Li, Pb, Tb, Bi, In, Lu, Nb, Sm, V, Zr, Ga, Mg, Gd, Y or TiAl, and the second work function metal layer 76 includes a p-type work functional metal such as, for example, Pt, Rh, Ir, Ru, Cu, Os, Be, Co, Pd, Te, Cr, Ni or TiN. The first work functional metal layer 74 may be formed by depositing a first metal on an entirety of the gate dielectric layer 72 using a deposition process such as for example, CVD, PVD or ALD and then removing the deposited first metal from the second device region 200 by etching. The removal of the deposited first metal from the second device region 200 exposes a portion of the gate dielectric layer 72 located in the second device region 200. After forming the first work functional metal layer 74, the second work function metal layer 76 may be formed by depositing a second metal on the first work functional metal layer 74 and the exposed portion of the gate dielectric layer 72 using CVD, PVD or ALD and then removing the deposited second metal from the first device region 100. The first work function metal layer 74 is thus re-exposed in the first device region 100. The thickness of each of the first and second work function metal layers 74, 76 can be from 3 nm to 10 nm, although lesser and greater thicknesses can also be employed. The work functional material layers are optional and can be omitted in some embodiments of the present application.

The gate electrode layer 78 may include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate electrode layer 78 may be formed utilizing a deposition process including, for example, CVD, PECVD, PVD, ALD and other like deposition processes. When a metal silicide is formed, a conventional silicidation process is employed. A planarization process, for example, CMP, may be performed to polish the surface of the gate electrode layer 78.

Figure 25:
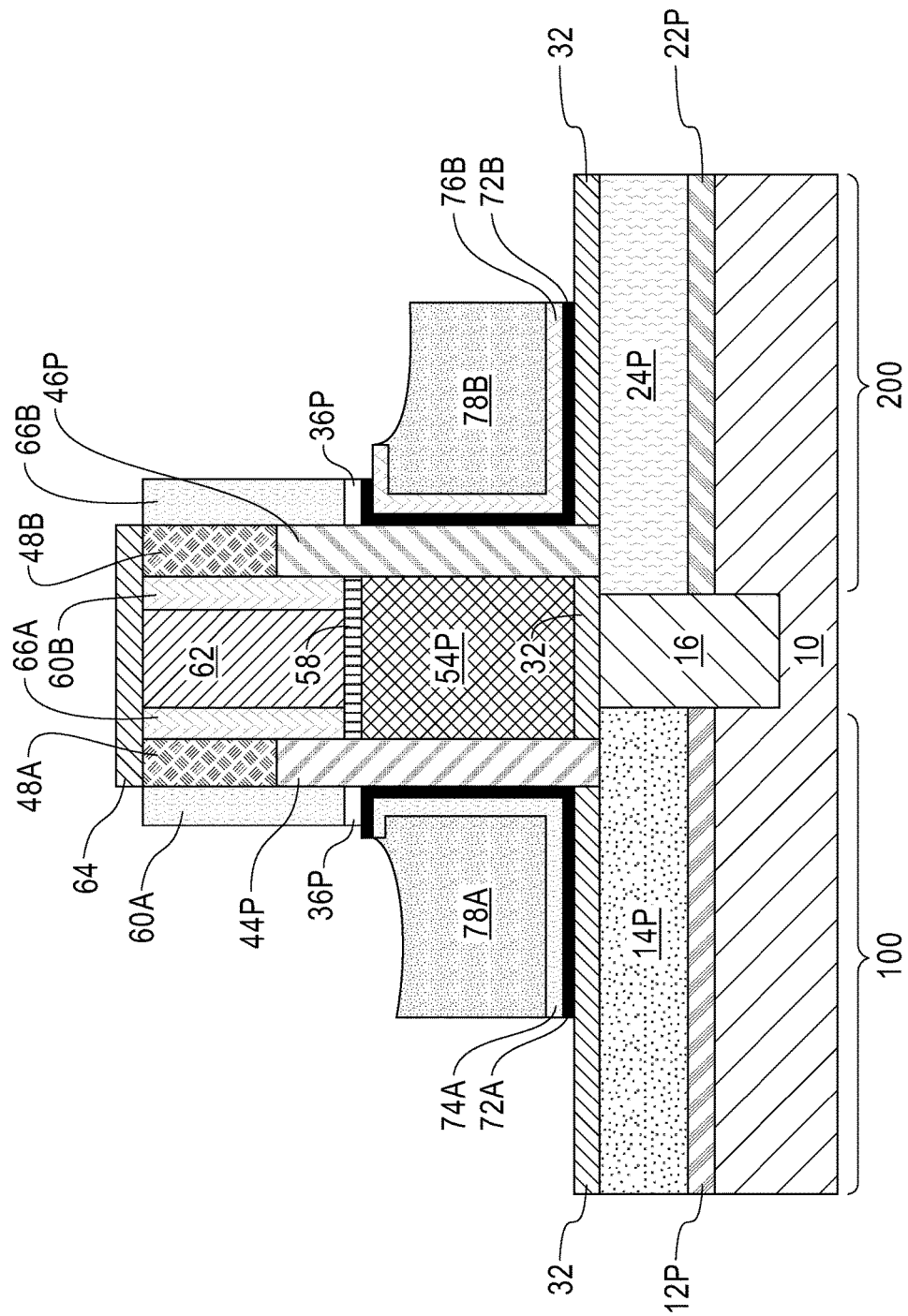
FIG. 25 is a cross-sectional view of the exemplary semiconductor structure of FIG. 24 after forming a first gate structure and a second gate structure.

Referring to FIG. 25, there is illustrated the exemplary semiconductor structure of FIG. 24 after forming a first gate structure laterally contacting the outer lengthwise sidewall and widthwise sidewalls of the channel portion of the first semiconductor fin 44P and a second gate structure laterally contacting the outer lengthwise sidewall and widthwise sidewalls of the channel portion of the second semiconductor fin 46P. The first gate structure includes a first gate dielectric 72A, a first work function metal 74A and a first gate electrode 78A. The second gate structure includes a second gate dielectric 72B, a second work function metal 76B and a second gate electrode 78B.

The first gate structure (72A, 74A, 78A) and the second gate structure (72B, 76B, 78B) can be formed by recessing the gate dielectric layer 72, the first work function metal layer 74, the second work function metal layer 76 and the gate electrode layer 78 below a bottom surface of each second spacer 36P. The recessing removes portions of the gate dielectric layer 72, the first work function metal layer 74, the second work function metal layer 76 and the gate electrode layer 78 from sidewalls of the third and fourth sacrificial sidewall spacers 66A, 66B and each second spacer 36P. In one embodiment, the gate dielectric layer 72, the first work function metal layer 74, the second work function metal layer 76 and the gate electrode layer 78 can be recessed by multiple etching processes. In one embodiment, a combination of RIE processes may be performed.

The first gate structure (72A, 74A, 78A) and the second gate structure (72B, 76B, 78B) can be formed by recessing the gate dielectric layer 72, the first work function metal layer 74, the second work function metal layer 76 and the gate electrode layer 78 below a bottom surface of each second spacer 36P. The recessing removes portions of the gate dielectric layer 72, the first work function metal layer 74, the second work function metal layer 76 and the gate electrode layer 78 from sidewalls of the third and fourth sacrificial sidewall spacers 66A, 66B and each second spacer 36P. In one embodiment, the gate dielectric layer 72, the first work function metal layer 74, the second work function metal layer 76 and the gate electrode layer 78 can be recessed by multiple etching processes. In one embodiment, a combination of RIE processes may be performed.

End portions of the gate dielectric layer 72, the first work function metal layer 74, the second work function metal layer 76 and the gate electrode layer 78 are then removed by lithography and etching. A combination of RIE processes may be performed. A remaining portion of the gate dielectric layer 72 located in the first device region 100 constitutes the first gate dielectric 72A, and a remaining portion of the gate dielectric layer 72 located in the second device region 200 constitutes the second gate dielectric 72B. A remaining portion of the first work function metal layer 74 located in the first device region 100 constitutes the first work function metal 74A. A remaining portion of the second work function metal layer 76 located in the second device region 200 constitutes the second work function metal 76B. A remaining portion of the gate electrode layer 78 located in the first device region 100 constitutes the first gate electrode 78A, and a remaining portion of the gate electrode layer 78 located in the second device region 200 constitutes the second gate electrode 78B. After formation of the first gate structure (72A, 74A, 78A) and the second gate structure (72B, 76B, 78B), the fifth patterned mask layer 64 can be removed, for example, by oxygen-based plasma etching.

Figure 26:
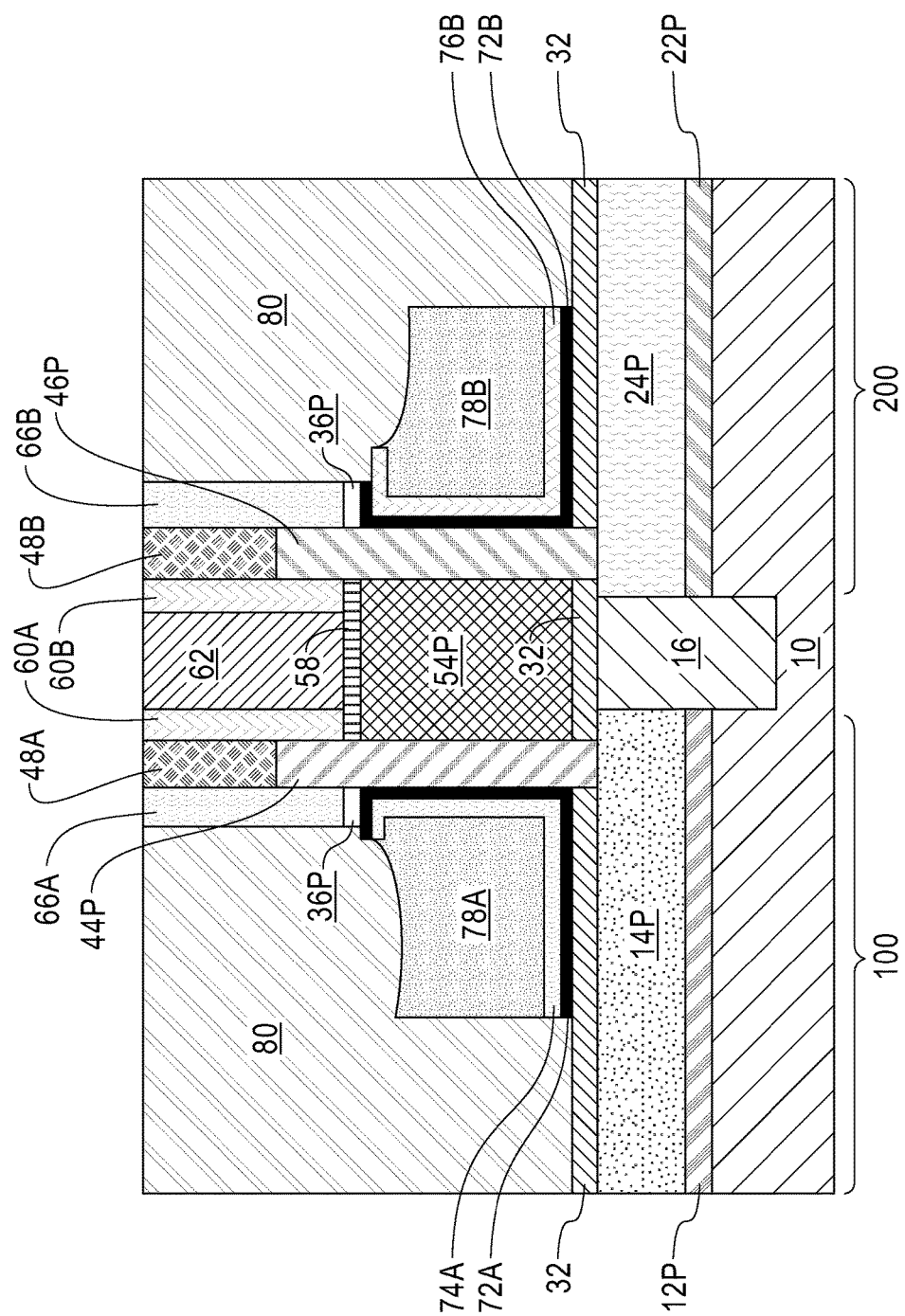
FIG. 26 is a cross-sectional view of the exemplary semiconductor structure of FIG. 25 after forming an ILD layer on the first spacer layer, the first gate structure and the second gate structure.

Referring to FIG. 26, there is illustrated the exemplary semiconductor structure of FIG. 25 after forming an ILD layer 80 on the first spacer layer 32, the first gate structure (72A, 74A, 78A) and the second gate structure (72B, 76B, 78B). The ILD layer 80 may include a low-k dielectric material (with k<4.0), including but not limited to, silicon oxide, spin-on-glass, a flowable oxide, a high density plasma oxide, borophosphosilicate glass (BPSG) or any combination thereof. The ILD layer 80 may be deposited, for example, by CVD, PVD or spin coating. The ILD layer 80 can be initially formed such that an entirety of the top surface of the ILD layer 80 is formed above the top surfaces of the ILD fill portion 62, the sacrificial sidewall spacers 60A, 60B, 66A, 66B and the dielectric caps 48A, 48B. The ILD layer 80 can be subsequently planarized, for example, by CMP and/or a recess etch. After planarization, the top surface of the ILD layer 80 is coplanar with the top surfaces of the ILD fill portion 62, the sacrificial sidewall spacers 60A, 60B, 66A, 66B and the dielectric caps 48A, 48B.

Figure 27:
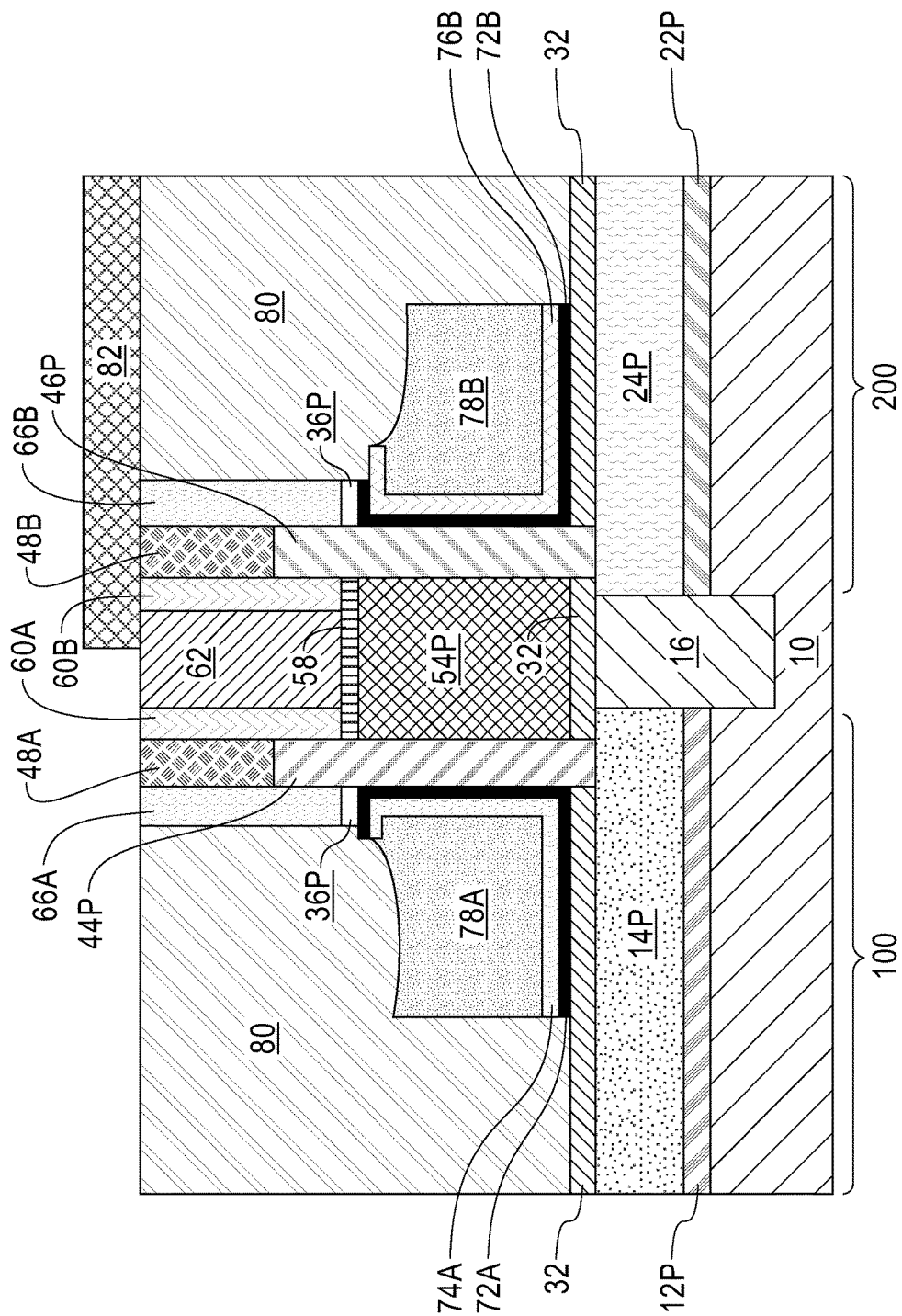
FIG. 27 is a cross-sectional view of the exemplary semiconductor structure of FIG. 26 after forming a sixth patterned mask layer covering the second device region, while exposing the first device region.

Referring to FIG. 27, there is illustrated the exemplary semiconductor structure of FIG. 26 after forming a sixth patterned mask layer 82 covering the second device region 200, while exposing the first device region 100. The first dielectric cap 48A and the first sacrificial sidewall spacer 60A and the third sacrificial sidewall spacer 66A that laterally surround the first dielectric cap 48A are thus exposed. The sixth patterned mask layer 82 can be a lithographically patterned mask layer and can be formed by performing processing steps described above in formation of the first patterned mask layer 20.

Figure 28:
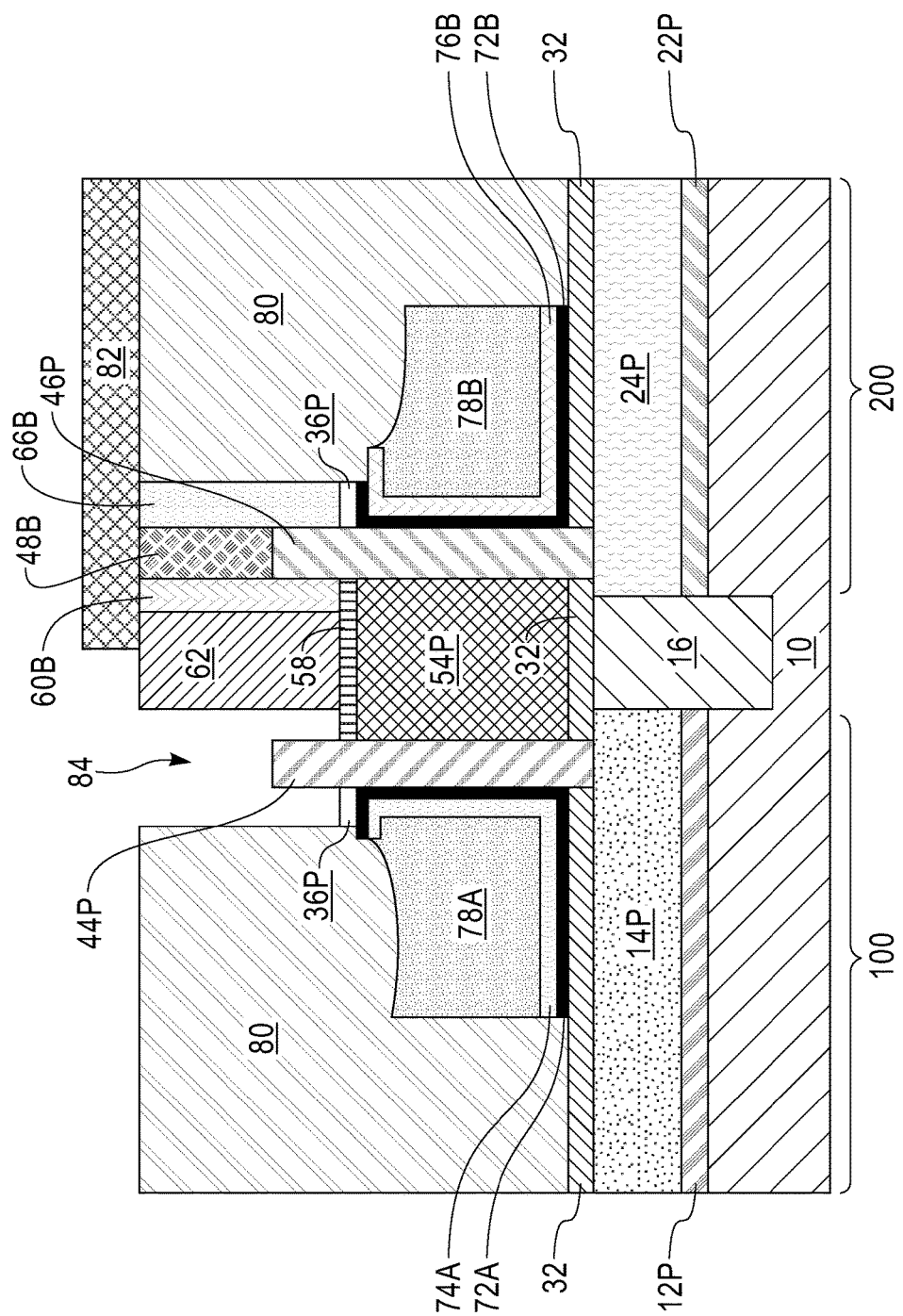
FIG. 28 is a cross-sectional view of the exemplary semiconductor structure of FIG. 27 after forming a first cavity exposing a top portion of the first semiconductor fin.

Referring to FIG. 28, there is illustrated the exemplary semiconductor structure of FIG. 27 after removing physically exposed first dielectric cap 48A, first sacrificial sidewall spacer 60A and third sacrificial sidewall spacer 66A, thereby forming a first cavity 84 exposing a top portion of the first semiconductor fin 44P. The first dielectric cap 48A, the first sacrificial sidewall spacer 60A and the third sacrificial sidewall spacer 66A can be removed by at least one etch which can be a dry etch or a wet etch. In one embodiment, RIE may be performed to remove the first dielectric cap 48A, the first sacrificial sidewall spacer 60A and the third sacrificial sidewall spacer 66A.

Figure 29:
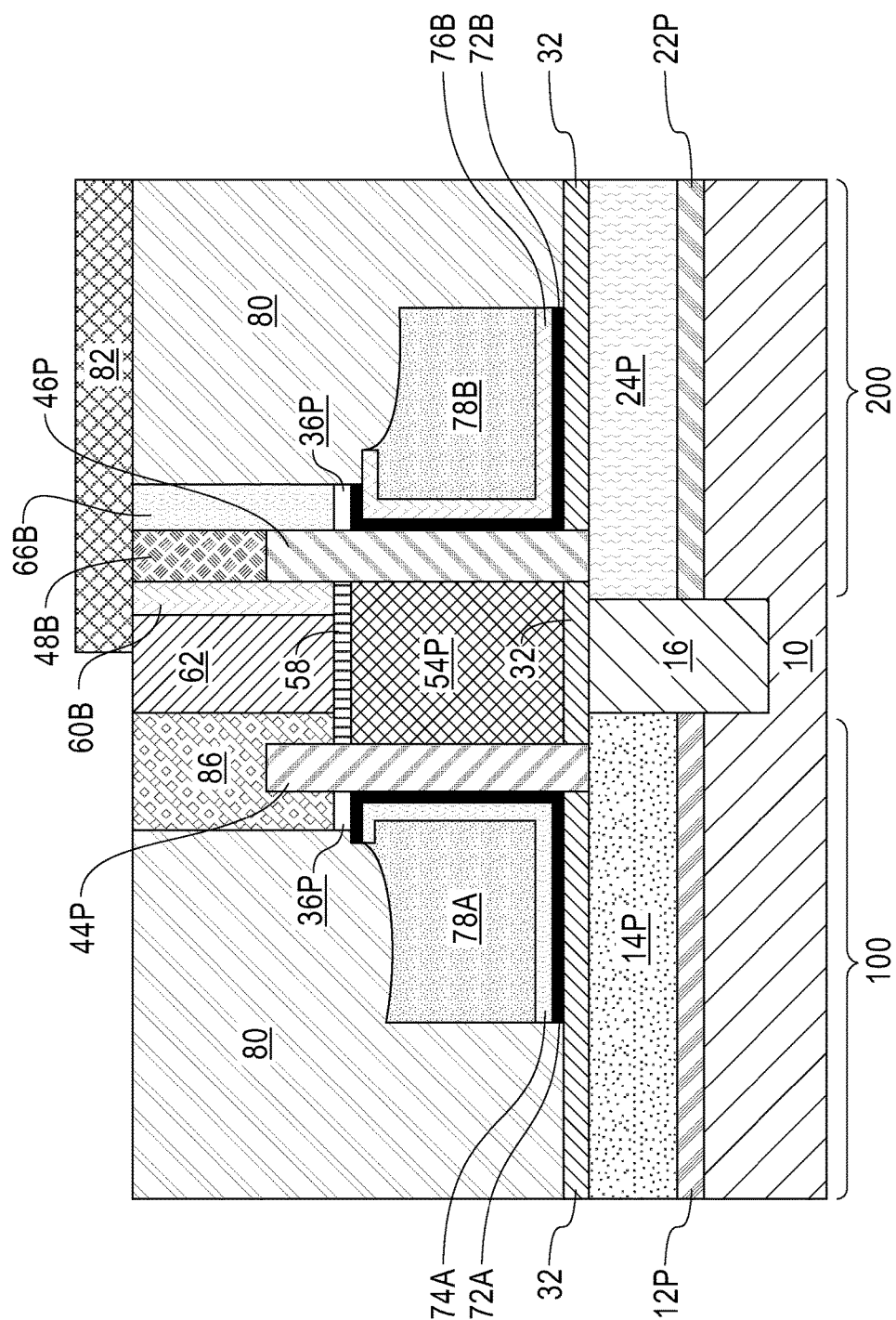
FIG. 29 is a cross-sectional view of the exemplary semiconductor structure of FIG. 28 after forming a first doped top semiconductor portion within the first cavity, surrounding the top portion of the first semiconductor fin.

Referring to FIG. 29, there is illustrated the exemplary semiconductor structure of FIG. 28 after forming a first doped top semiconductor portion 86 within the first cavity 84, surrounding the top portion of the first semiconductor fin 44P. In one embodiment and when the first device region 100 is an n-type semiconductor device region, the first doped top semiconductor portion 86 may include SiGe or a II-V compound semiconductor including, but not limited to, InGaAs and InAs. The first doped top semiconductor portion 86 also contains a dopant of the same conductivity type as that of the dopant in the first doped bottom semiconductor portion 14P. In one embodiment, the first doped top semiconductor portion 86 includes an n-type dopant. The first doped top semiconductor portion 86 can be formed utilizing a selective epitaxial growth process described above in formation of the epitaxial semiconductor fin layers 44, 46. The dopant can be provided during the epitaxial growth process by in-situ doping, or after epitaxial growth process by ion implantation or gas phase doping. After formation of the first doped top semiconductor portion 86, the sixth patterned mask layer 82 can be removed, for example, by oxygen-based plasma etching. The first doped top semiconductor portion 86 serves as a drain region for the first FET formed in the first device region 100.

Figure 30:
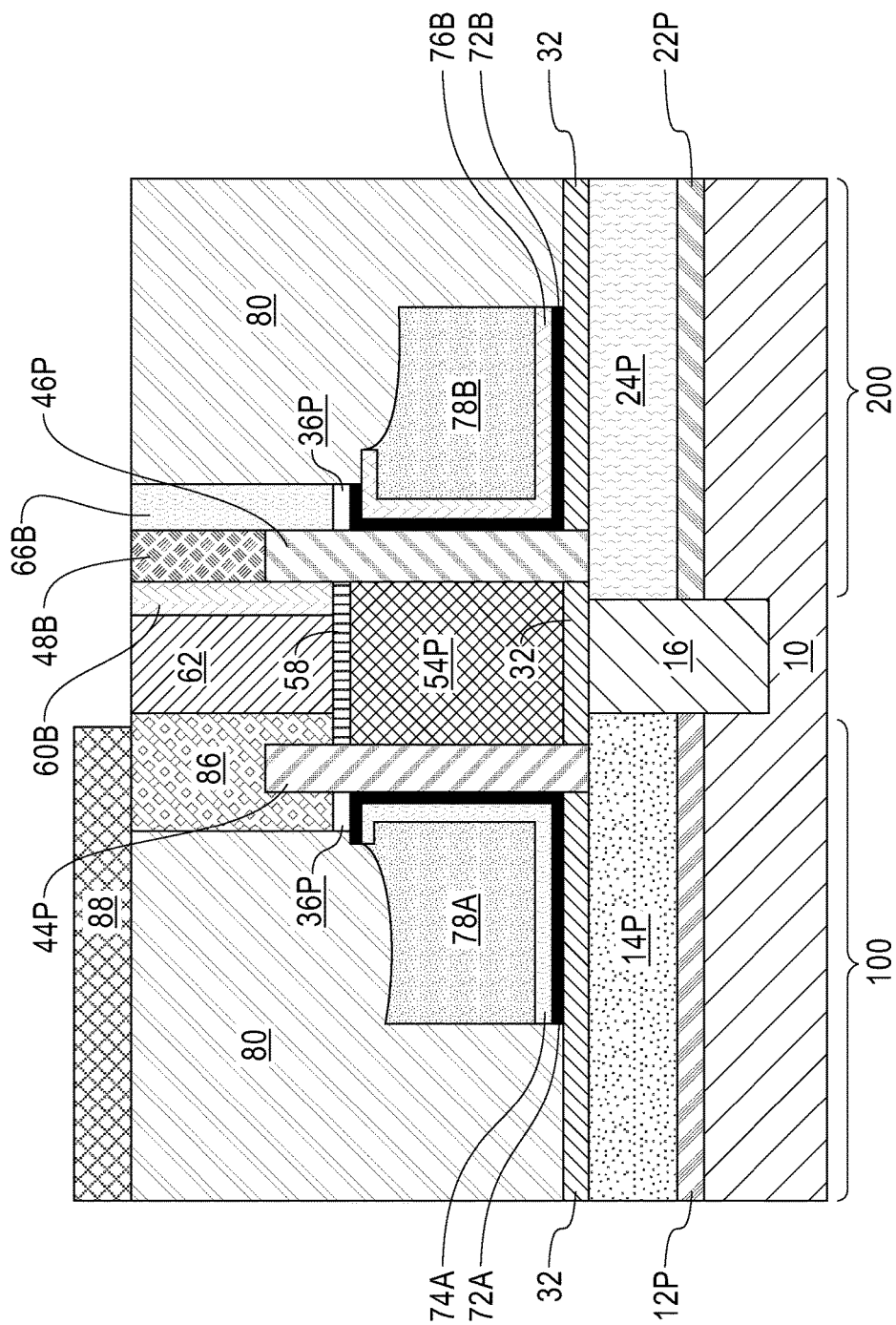
FIG. 30 is a cross-sectional view of the exemplary semiconductor structure of FIG. 29 after forming a seventh patterned mask layer covering the first device region, while exposing the second device region.

Referring to FIG. 30, there is illustrated the exemplary semiconductor structure of FIG. 29 after forming a seventh patterned mask layer 88 covering the first device region 100, while exposing the second device region 200. The seventh patterned mask layer 88 is present over the first doped top semiconductor portion 86, but is not present over the second dielectric cap 48B and the second inner sidewall spacer 60B and the second outer sidewall spacer 66B that laterally surround the second dielectric cap 48B. The seventh patterned mask layer 88 can be a lithographically patterned mask layer and can be formed by performing processing steps described above in formation of the first patterned mask layer 20.

Figure 31:
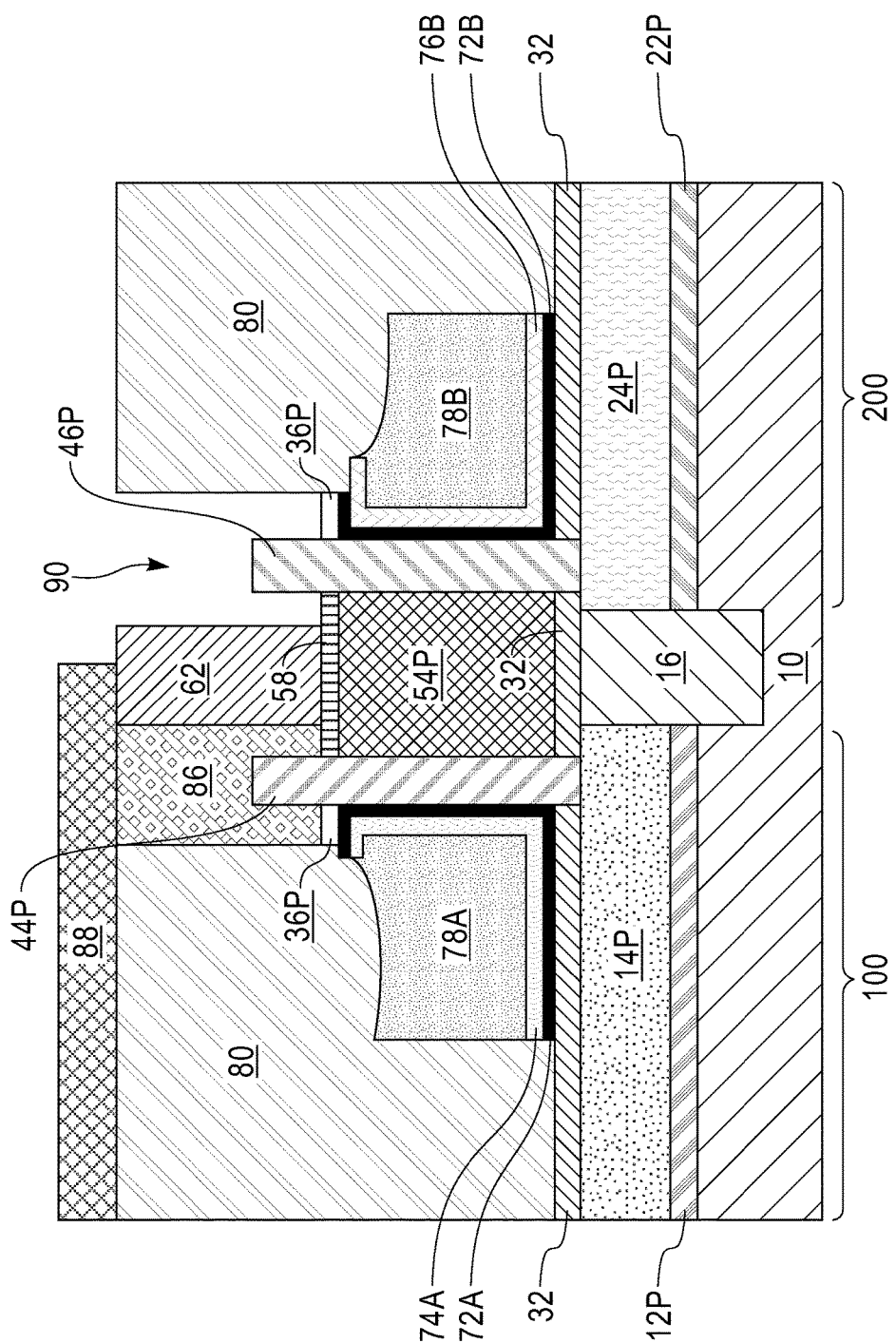
FIG. 31 is a cross-sectional view of the exemplary semiconductor structure of FIG. 30 after forming a second cavity exposing a top portion of the second semiconductor fin.

Referring to FIG. 31, there is illustrated the exemplary semiconductor structure of FIG. 30 after removing physically exposed second dielectric cap 48B, second sacrificial sidewall spacer 60B and fourth sacrificial sidewall spacer 66B by performing the processing steps described above in FIG. 26. A second cavity 90 is formed exposing a top portion of the second semiconductor fin 46P.

Figure 32:
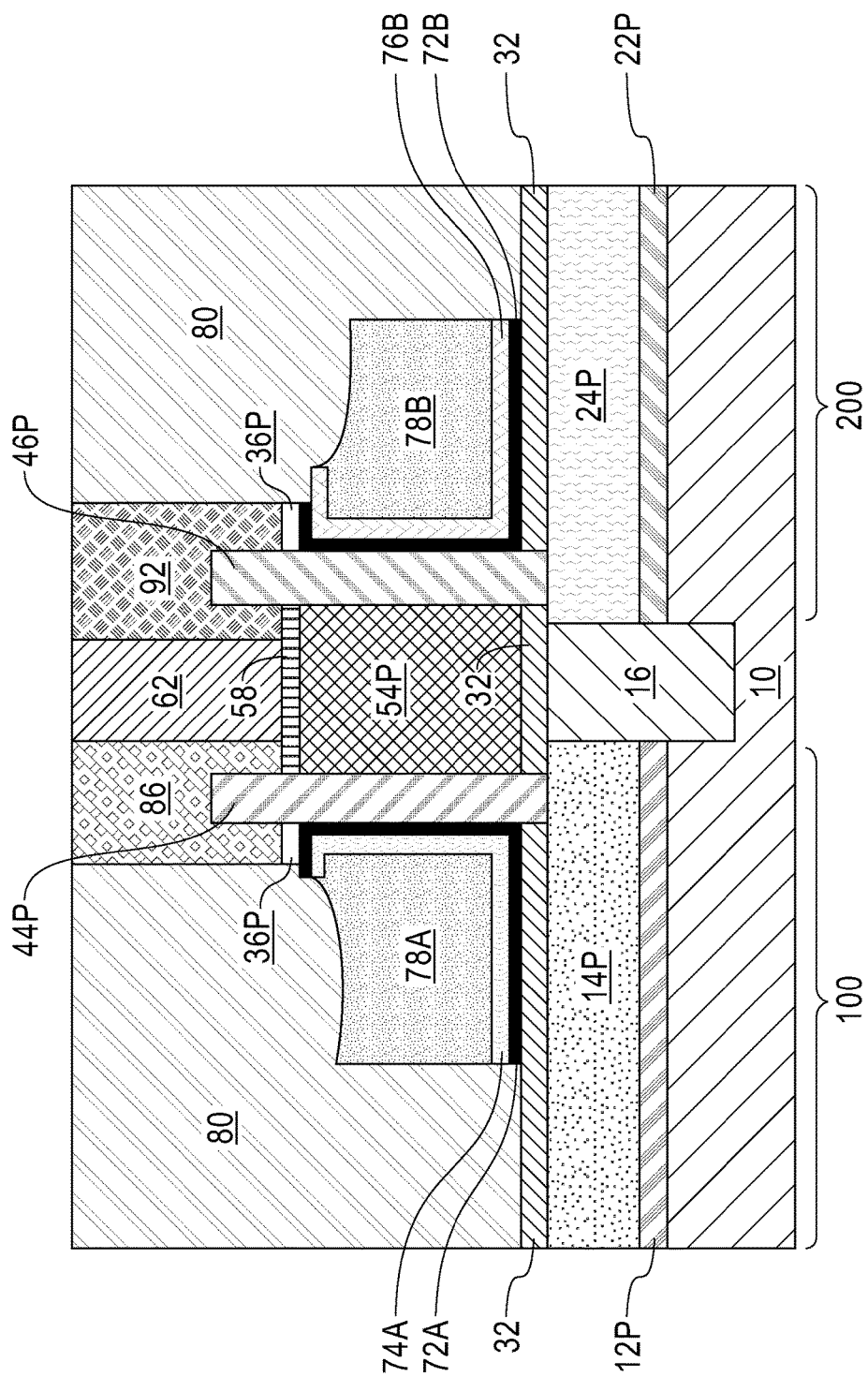
FIG. 32 is a cross-sectional view of the exemplary semiconductor structure of FIG. 31 after forming a second doped top semiconductor portion within the second cavity, surrounding the top portion of the second semiconductor fin.

Referring to FIG. 32, there is illustrated the exemplary semiconductor structure of FIG. 31 after forming a second doped top semiconductor portion 92 within the second cavity 90, surrounding the top portion of the second semiconductor fin 46P. In one embodiment and when the second device region 200 is a p-type semiconductor device region, the second doped top semiconductor portion 92 may include Si. The second doped top semiconductor portion 92 also contains a dopant of the same conductivity type as that of the dopant in the second doped bottom semiconductor portion 24P. In one embodiment, the second doped top semiconductor portion 92 includes a p-type dopant. The second doped top semiconductor portion 92 can be formed utilizing a selective epitaxial growth process described above in formation of the first doped top semiconductor portion 86 described above in FIG. 29. The dopant can be provided during the epitaxial growth process by in-situ doping, or after epitaxial growth process by ion implantation or gas phase doping. After formation of the second doped top semiconductor portion 92, the seventh patterned mask layer 88 can be removed, for example, by oxygen-based plasma etching. The second doped top semiconductor portion 92 serves as a drain region for the second FET formed in the first device region 100.

Thus, a first vertical FET is formed in the first device region 100 and a second vertical FET is formed in the second device region 200. The first vertical FET includes a first semiconductor fin 44P, a first doped bottom semiconductor portion 14P located beneath the first semiconductor fin 44P, a first doped top semiconductor portion 86 surrounding a top portion of the first semiconductor fin 44P, and a first gate structure (72A, 74A, 78A) contacting an outer lengthwise sidewall and widthwise sidewalls of the first semiconductor fin 44P. A portion of the first spacer layer 32 is located between the first gate structure (72A, 74A, 78A) and the first doped bottom semiconductor portion 14P, and a second spacer 36P is located between the first gate structure (72A, 74A, 78A) and the first doped top semiconductor portion 86.

The second vertical FET includes a second semiconductor fin 46P, a second doped bottom semiconductor portion 24P located beneath the second semiconductor fin 46P, a second doped top semiconductor portion 92 surrounding a top portion of the second semiconductor fin 46P, and a second gate structure (72B, 76B, 78B) contacting an outer lengthwise sidewalls and widthwise sidewalls of the second semiconductor fin 46P. Each of the second doped bottom semiconductor portion 24P and the second doped top semiconductor portion 94 contains a dopant having a conductivity type opposite to a dopant contained in each of the first doped bottom semiconductor portion 14P and the first doped top semiconductor portion 86. Another portion of the first spacer layer 32 is located between the second gate structure (72B, 76B, 78B) and the second doped bottom semiconductor portion 24P, and another second spacer 36P is located between the second gate structure (72B, 76B, 78B) and the second doped top semiconductor portion 92.

A dielectric fill portion 54P is formed between the first semiconductor fin 44P and the second semiconductor fin 46P, electrically insulating the first vertical FET and the second vertical FET. The dielectric fill portion 54P contacts an inner lengthwise sidewall (i.e., proximal sidewall) of each of the first semiconductor fin 44P and the second semiconductor fin 46P.

In a conventional vertical CMOS transistor layout, a gate structure is typically formed contacting both proximal and distal sidewalls of each semiconductor fin in a semiconductor fin pair for formation of NFET and PFET. In the present application, a gate structure for each of NFET and PFET is formed to be absent from the proximal sidewall of each semiconductor fin in the semiconductor fin pair. The space between the NFET and PFET is thus reduced. The area gain obtained by such device configuration comparing to the conventional CMOS transistor layout can be from 20% to 30%. As a result, CMOS vertical transistors with tight pitch can be formed.

Figure 33A:
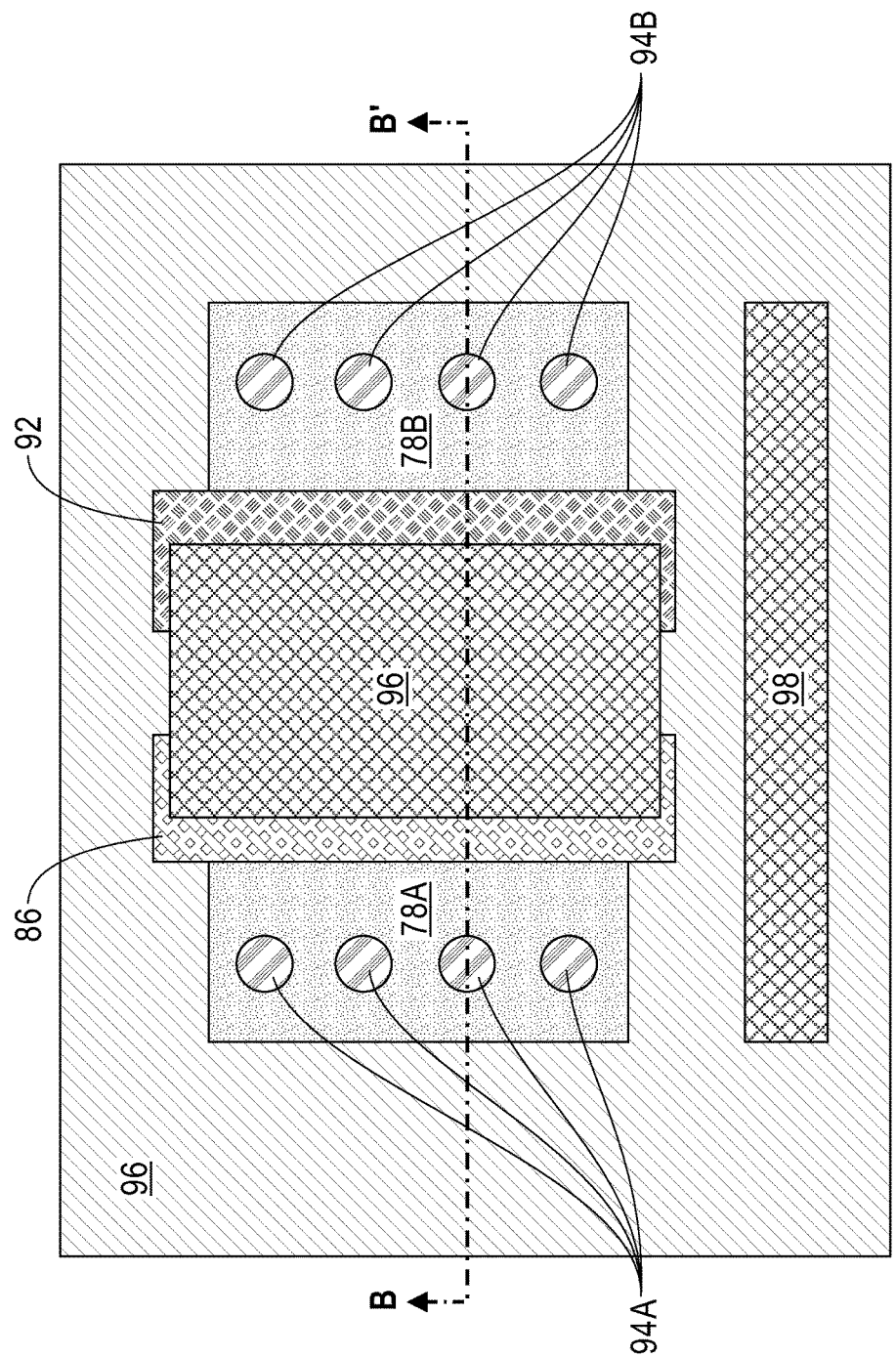
FIG. 33A is a top-down view of the exemplary semiconductor structure of FIG. 32 after forming various contact structures.
Figure 33B:
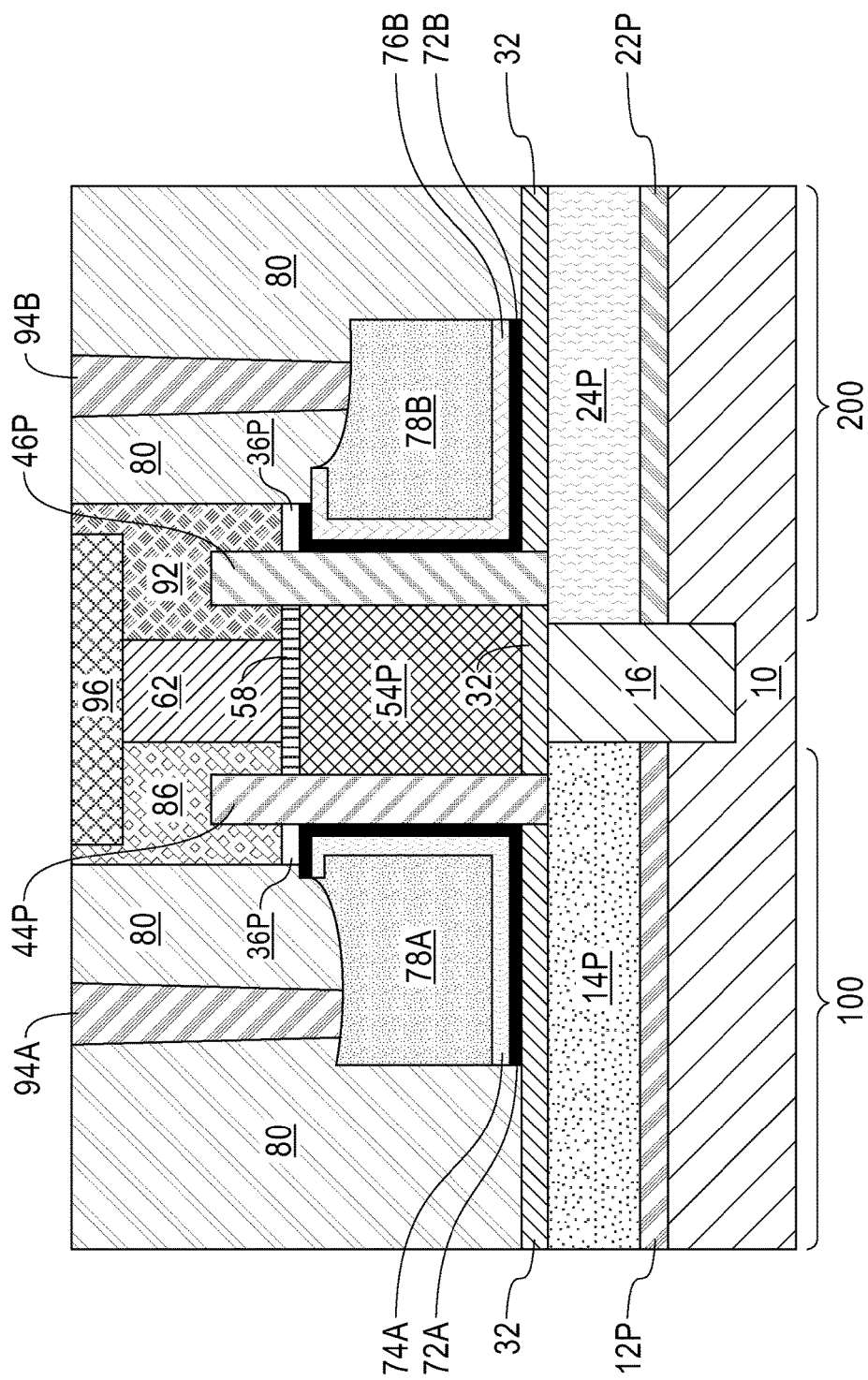
FIG. 33B is a cross-sectional view of the exemplary semiconductor structure of FIG. 33A along line B-B'.

Referring to FIGS. 33A and 33B, there are illustrated the exemplary semiconductor structure of FIG. 32 after forming various contact structures. The various contact structures includes a first gate contact structure 94A extending into the ILD layer 80 to form contact with the first gate electrode 78A, a second gate contact structure 94B extending into the ILD layer 80 to form contact with the second gate electrode 78B, a first shared contact structure 96 electrically connecting the first doped top semiconductor portion 86 and the second doped top semiconductor portion 92, and a second shared contact structure 98 electrically connecting the first doped bottom semiconductor portion 14P and the second doped bottom semiconductor portion 24P. A transmission gate including an NFET (e.g., the first vertical FET) in parallel electrical connection with a PFET (e.g., the second vertical FET) is thus provided.

The first and second gate contact structures 94A, 94B can be formed by formation of gate contact openings (not shown) in the ILD layer 80 utilizing a combination of lithographic patterning and anisotropic etch followed by deposition of a conductive material such as, for example, Cu or W and planarization that removes excess conductive material from above the top surface of the ILD layer 80.

Likewise, the first shared contact structure 96 can be formed by formation of a first source/drain contact opening (not shown) in the first doped top semiconductor portion 86, the ILD fill portion 62 and the second doped top semiconductor portion 92 utilizing a combination of lithographic patterning and anisotropic etch followed by deposition of a conductive material such as, for example, Cu or W and planarization that removes excess conductive material from above the top surface of the ILD layer 80.

The second shared contact structure 98 can be formed by formation of a second source/drain contact opening (not shown) extending through the ILD layer 80 and the first spacer layer 32 utilizing a combination of lithographic patterning and anisotropic etch followed by deposition of a conductive material such as, for example, Cu or W and planarization that removes excess conductive material from above the top surface of the ILD layer 80.

Optionally, contact liners (not shown) may be formed on the sidewalls and bottoms surfaces of each contact opening before filling each contact opening with the conductive material. The contact liners may include TiN.

In the present application additional space thus is saved by using a common contact structure 96 electrically connecting the first and second doped top semiconductor portions 86, 92, rather than using two contact structures that separately contacting the first and second doped top semiconductor portions 86, 92 and wiring them in upper metallization layers as in case of the conventional vertical COMS transistor layout. Simple wiring of input, output, and control lines can thus be achieved in the present application.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A method of forming a semiconductor structure comprising:
    forming a first doped bottom semiconductor portion over a first region of a semiconductor substrate;
    forming a second doped bottom semiconductor portion over a second region of the semiconductor substrate;
    forming a sacrificial gate layer over the first doped bottom semiconductor portion and the second doped bottom semiconductor portion;
    forming a dielectric capping layer over the sacrificial gate layer;
    forming a first semiconductor fin within a first trench extending through the dielectric capping layer and the sacrificial gate layer, wherein the first semiconductor fin contacts a surface of a portion of the first doped bottom semiconductor portion;
    forming a second semiconductor fin in a second trench extending through the dielectric capping layer and the sacrificial gate layer, wherein the second semiconductor fin contacts a surface of a portion of the second doped bottom semiconductor portion;
    removing entire portions of the dielectric capping layer and the sacrificial gate layer located between the first semiconductor fin and the second semiconductor fin to provide an opening exposing a proximal sidewall of the first semiconductor fin and a proximal sidewall of the second semiconductor fin;
    forming a dielectric fill portion within the opening, the dielectric fill portion contacting the proximal sidewall of the first semiconductor fin and the proximal sidewall of the second semiconductor fin;
    removing the sacrificial gate layer to expose a channel portion of the first semiconductor fin and a channel portion of the second semiconductor fin;
    forming a first gate structure along sidewalls of the channel portion of the first semiconductor fin that are not covered by the dielectric fill portion and a second gate structure along sidewalls of the channel portion of the second semiconductor fin that are not covered by the dielectric fill portion;
    removing the dielectric capping layer to expose a top portion of each of the first semiconductor fin and the second semiconductor fin;
    forming a first doped top semiconductor portion surrounding the top portion of the first semiconductor fin; and
    forming a second doped top semiconductor portion surrounding the top portion of the second semiconductor fin.

2. The method of claim 1, further comprising forming a first dielectric cap over the first semiconductor fin within the first trench and a second dielectric cap over the second semiconductor fin within the second trench, wherein a top surface of each of the first dielectric cap and the second dielectric cap is coplanar with a top surface of the dielectric capping layer, and wherein the opening exposes a proximal sidewall of the first dielectric cap and a proximal sidewall of the second dielectric cap, and wherein the removing the dielectric capping layer exposes the first dielectric cap and the second dielectric cap.

3. The method of claim 2, further comprising forming sacrificial sidewall spacers on sidewalls of the top portion of each of the first semiconductor fin and the second semiconductor fin, the first dielectric cap and the second dielectric cap prior to the removing the sacrificial gate layer.

4. The method of claim 3, further comprising forming an interlevel dielectric (ILD) portion over the dielectric fill portion to completely fill the opening.

5. The method of claim 4, further comprising forming an ILD layer over the first doped bottom semiconductor portion and the second doped bottom semiconductor portion, wherein the ILD layer laterally surrounds the first gate structure, the second gate structure and the sacrificial sidewall spacers.

6. The method of claim 5, wherein the forming the first doped top semiconductor portion comprises:
    removing the sacrificial sidewall spacers present on the sidewalls of the top portion of the first semiconductor fin and the first dielectric cap to provide a first cavity; and
    epitaxially depositing a first semiconductor material in the first cavity.

7. The method of claim 6, wherein the forming the second doped top semiconductor portion comprises:
    removing the sacrificial sidewall spacers present on the sidewalls of the top portion of the second semiconductor fin and the second dielectric cap to provide a second cavity; and
    epitaxially depositing a second semiconductor material in the second cavity.

8. The method of claim 1, further comprising forming a first shared contact structure connecting the first doped top semiconductor portion and the second doped top semiconductor portion.

9. The method of claim 1, further comprising forming a first oxide layer on sidewall surfaces of the sacrificial gate layer that are exposed by the first trench prior to the forming the first semiconductor fin, and a second oxide layer on sidewall surfaces of the sacrificial gate layer that are exposed by the second trench prior to the forming the second semiconductor fin, and removing the first oxide layer and the second oxide layer prior to the forming the first gate structure and the second gate structure.

* * * * *